(12) United States Patent
Lee et al.

(10) Patent No.: US 10,121,415 B2
(45) Date of Patent: Nov. 6, 2018

(54) ORGANIC LIGHT EMITTING DIODE DISPLAY

(71) Applicant: SAMSUNG DISPLAY CO., LTD., Yongin-si, Gyeonggi-do (KR)

(72) Inventors: Dong Sun Lee, Cheonan-si (KR); Dong-Hwi Kim, Asan-si (KR); Jae-Sic Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 352 days.

(21) Appl. No.: 14/919,680

(22) Filed: Oct. 21, 2015

(65) Prior Publication Data

US 2016/0210905 A1 Jul. 21, 2016

(30) Foreign Application Priority Data

Jan. 20, 2015 (KR) .................. 10-2015-0009415

(51) Int. Cl.
*G09G 3/3233* (2016.01)
*H01L 27/12* (2006.01)
*H01L 27/32* (2006.01)

(52) U.S. Cl.
CPC ......... *G09G 3/3233* (2013.01); *H01L 27/124* (2013.01); *H01L 27/1222* (2013.01);
(Continued)

(58) Field of Classification Search
CPC .. G09G 3/3275; G09G 3/3233; G09G 3/2092; G09G 2320/0209;
(Continued)

(56) References Cited

U.S. PATENT DOCUMENTS

| 6,569,717 | B1 * | 5/2003 | Murade | G02F 1/136213 |
| | | | | 257/296 |
| 7,298,351 | B2 * | 11/2007 | Kim | G09G 3/3216 |
| | | | | 345/39 |
| 2003/0155588 | A1 * | 8/2003 | Murade | G02F 1/136209 |
| | | | | 257/213 |

(Continued)

FOREIGN PATENT DOCUMENTS

| JP | 2009-37100 A | 2/2009 |
| KR | 10-0758278 B1 | 9/2007 |
| KR | 10-1103615 B1 | 1/2012 |
| KR | 10-2014-0018623 A | 2/2014 |

*Primary Examiner* — Amare Mengistu
*Assistant Examiner* — Jennifer Zubajlo
(74) *Attorney, Agent, or Firm* — Lewis Roca Rothgerber Christie LLP

(57) ABSTRACT

An OLED display according to an exemplary embodiment of the present disclosure includes: a substrate; a scan line on the substrate and configured to transmit a scan signal; a data line crossing the scan line and configured to transmit a data voltage; a driving voltage line crossing the scan line and configured to transmit a driving voltage, a portion of the driving voltage line being a second storage electrode; a switching transistor connected to the scan line and the data line; a driving transistor connected to the switching transistor and including a driving gate electrode; a driving connecting member connected to the driving gate electrode; a first storage electrode, the second storage electrode overlapping the first storage electrode; a shielding member connected to the second storage electrode and between the driving connecting member and the data line; and an organic light emitting diode connected to the driving transistor.

18 Claims, 12 Drawing Sheets

(52) U.S. Cl.
CPC ...... *H01L 27/1225* (2013.01); *H01L 27/1255* (2013.01); *G09G 2300/0819* (2013.01); *G09G 2300/0842* (2013.01); *G09G 2300/0861* (2013.01); *G09G 2320/0238* (2013.01); *H01L 27/3265* (2013.01); *H01L 27/3272* (2013.01); *H01L 27/3276* (2013.01)

(58) Field of Classification Search
CPC ... G09G 2320/0238; G09G 2300/0426; G09G 2300/043; G09G 2300/0819; G09G 2300/0842; G09G 2300/0861; H01L 27/1222; H01L 27/1225; H01L 27/124; H01L 27/1255; H01L 27/3244; H01L 27/3265; H01L 27/3272; H01L 27/3276
See application file for complete search history.

(56) References Cited

U.S. PATENT DOCUMENTS

| | | | |
|---|---|---|---|
| 2007/0103608 A1* | 5/2007 | Lee | G02F 1/13454 349/38 |
| 2008/0079005 A1* | 4/2008 | Tseng | H01L 27/3272 257/72 |
| 2010/0176381 A1* | 7/2010 | Yagi | G02F 1/1368 257/40 |
| 2012/0327321 A1* | 12/2012 | Huang | G02F 1/1362 349/42 |
| 2013/0222355 A1* | 8/2013 | Choi | G09G 3/348 345/211 |
| 2013/0328853 A1* | 12/2013 | Hong | H01L 27/3265 345/212 |

* cited by examiner

ORGANIC LIGHT EMITTING DIODE DISPLAY

CROSS-REFERENCE TO RELATED APPLICATION

This application claims priority to and the benefit of Korean Patent Application No. 10-2015-0009415, filed in the Korean Intellectual Property Office on Jan. 20, 2015, the content of which is incorporated herein in its entirety by reference.

BACKGROUND

1. Field

Aspects of embodiments of the present disclosure relate an organic light emitting diode display.

2. Description of the Related Art

An organic light emitting diode display includes two electrodes and an organic light emitting layer positioned therebetween. Electrons injected from a cathode, that is, an electrode, and holes injected from an anode, that is, another electrode, are combined with (e.g., bonded to) each other in the organic light emitting layer to form excitons. Light is emitted when the excitons discharge energy.

The organic light emitting diode display includes a plurality of pixels, each including an organic light emitting diode include the cathode, the anode, and the organic light emitting layer. A plurality of thin film transistors and capacitors for driving the organic light emitting diode are formed in each pixel. The plurality of thin film transistors generally include a switching thin film transistor and a driving thin film transistor.

The driving transistor controls a driving current flowing to the organic light emitting diode and provides a data voltage to the storage capacitor which is connected to a driving gate node of the driving transistor to be maintained during one frame. Accordingly, a driving current (e.g., a predetermined amount of the driving current) is supplied from the driving transistor to the organic light emitting diode during one frame to be emitted.

However, due to parasitic capacitance formed between the driving gate node connected to the driving gate electrode of the driving transistor and the data line, a voltage change of the data line (e.g., a change in the voltage transmitted by the data line) affects the voltage of the driving gate node of the driving transistor. The voltage change of the driving gate node changes the driving current flowing to the organic light emitting diode such that vertical crosstalk, generating a luminance change, occurs.

To reduce or prevent this phenomenon, a distance between the data line and the driving gate node is increased; however the size of the pixel is relatively small in high resolution display devices and, thus, it is difficult to decrease a process design due to equipment specifications and a photolithography process, so there are limitations in reducing or minimizing the vertical crosstalk by using this approach.

The above information disclosed in this Background section is only for enhancement of understanding of the background of the disclosure and therefore it may contain information that does not form the prior art that is already known to a person of ordinary skill in the art.

SUMMARY

Aspects of embodiments of the present disclosure provide an organic light emitting diode display capable of reducing or minimizing vertical crosstalk in a high resolution structure.

An organic light emitting diode display according to an exemplary embodiment of the present disclosure includes: a substrate; a scan line on the substrate and configured to transmit a scan signal; a data line crossing the scan line and configured to transmit a data voltage; a driving voltage line crossing the scan line and configured to transmit a driving voltage, a portion of the driving voltage line being a second storage electrode; a switching transistor connected to the scan line and the data line; a driving transistor connected to the switching transistor, and including a driving gate electrode; a driving connecting member connected to the driving gate electrode; a first storage electrode being a portion of the driving gate electrode, the second storage electrode overlapping the first storage electrode; a shielding member connected to the second storage electrode and between the driving connecting member and the data line; and an organic light emitting diode connected to the driving transistor.

The data line may include a first data line and a second data line adjacent to each other, and the shielding member may include a first shielding member between the driving connecting member and the first data line and a second shielding member between the driving connecting member and the second data line.

The first shielding member and the second shielding member may be on the same layer as the scan line.

The organic light emitting diode display may further include a gate insulating layer on the substrate; and an interlayer insulating layer covering the first shielding member and the second shielding member, the first shielding member and the second shielding member being on the gate insulating layer. The first shielding member and second shielding member may be connected to the second storage electrode via a first shielding connection opening and a second shielding connection opening, the first shielding connection opening and the second shielding connection opening extending through the interlayer insulating layer.

The second storage electrode, the driving voltage line, the driving connecting member, and the data line may be on the interlayer insulating layer.

The organic light emitting diode display may further include a compensation transistor configured to be turned on in accordance with a scan signal and to compensate a threshold voltage of the driving transistor, the compensation transistor being connected to the driving drain electrode of the driving transistor. The driving connecting member may connect the compensation drain electrode of the compensation transistor and the driving gate electrode to each other.

The organic light emitting diode display may further include a semiconductor on the substrate and including a switching channel of the switching transistor. The driving channel may overlap the driving gate electrode, and the driving channel may be curved.

The driving voltage line may include a first driving voltage line parallel to the data line and a second driving voltage line crossing the data line, and the first driving voltage line may be on the same layer as the data line, and the second driving voltage line may be on the same layer as the scan line.

An organic light emitting diode display according to an exemplary embodiment of the present disclosure includes: a substrate; a scan line on the substrate and configured to transmit a scan signal; a data line and a driving voltage line crossing the scan line and configured to transmit a data voltage and a driving voltage, respectively; a switching transistor connected to the scan line and the data line; a driving transistor connected to the switching transistor; a driving connecting member connected to a driving gate electrode of the driving transistor; and an organic light emitting diode connected to the driving transistor, wherein a first height between the substrate and the driving connecting member is different than a second height between the substrate and the data line. According to one embodiment, the first height between the substrate and the driving connecting member may be less than the second height between the substrate and the data line.

The organic light emitting diode display may further include a first gate insulating layer, a second gate insulating layer, and an interlayer insulating layer sequentially formed on the substrate. A portion of the driving connecting member may be on the first gate insulating layer and the interlayer insulating layer, and the data line may be on the first gate insulating layer, the second gate insulating layer, and the interlayer insulating layer.

A portion of the driving connecting member may be aligned with a shielding opening in the second gate insulating layer.

The scan line and the first storage electrode may be between the first gate insulating layer and the second gate insulating layer.

One end of the driving connecting member may be connected to the driving gate electrode via a contact opening extending through the second gate insulating layer and the interlayer insulating layer, and the other end of the driving connecting member may be connected to the compensation drain electrode of the compensation transistor via a contact opening extending through the first gate insulating layer, the second gate insulating layer, and the interlayer insulating layer.

The second storage electrode may have a storage opening exposing the second gate insulating layer, and one end of the driving connecting member and the driving gate electrode may be connected via a contact opening extending through the storage opening.

The driving connecting member may be on the same layer as and spaced from the data line.

The organic light emitting diode display may further include a semiconductor on the substrate and including a switching channel of the switching transistor and a driving channel of the driving transistor. The driving channel may overlap the driving gate electrode, and the driving channel may be curved.

The organic light emitting diode may include a pixel electrode connected to the driving transistor, an organic emission layer on the pixel electrode, and a common electrode on the organic emission layer, and an initialization voltage line on the same layer as the pixel electrode and configured to transmit an initialization voltage to initialize the driving transistor.

According to embodiments of the present disclosure, by positioning the shielding member, which is connected to the second storage electrode which is a portion of the driving voltage line, between the driving connecting member and the data line, parasitic capacitance between the driving connecting member and the data line may be reduced or prevented.

Also, by forming the shielding opening, formed by removing a portion of the second gate insulating layer under the driving connecting member, to lower the height of the driving connecting member above the substrate, the distance between the data line and the driving connecting member is increased such that the parasitic capacitance between the driving connecting member and the data line may be reduced or minimized.

Accordingly, kickback voltage due to the above-described parasitic capacitance is reduced or minimized such that the change of the driving gate voltage of the driving gate electrode, which is connected to the connecting member as the driving gate node GN, is decreased, thereby reducing or minimizing the vertical crosstalk.

Also, the data voltage may be increased by reducing or minimizing the kickback voltage due to parasitic capacitance such that a driving range of the driving gate-source voltage Vgs between the driving gate electrode and the driving source electrode may be increased. Accordingly, light emitted from the organic light emitting diode OLD (e.g., grey light emitted from the OLD) may be more finely controlled, and as a result, a resolution of the organic light emitting diode display may be enhanced and display quality may be improved.

DETAILED DESCRIPTION OF THE EMBODIMENTS

Figure 1:
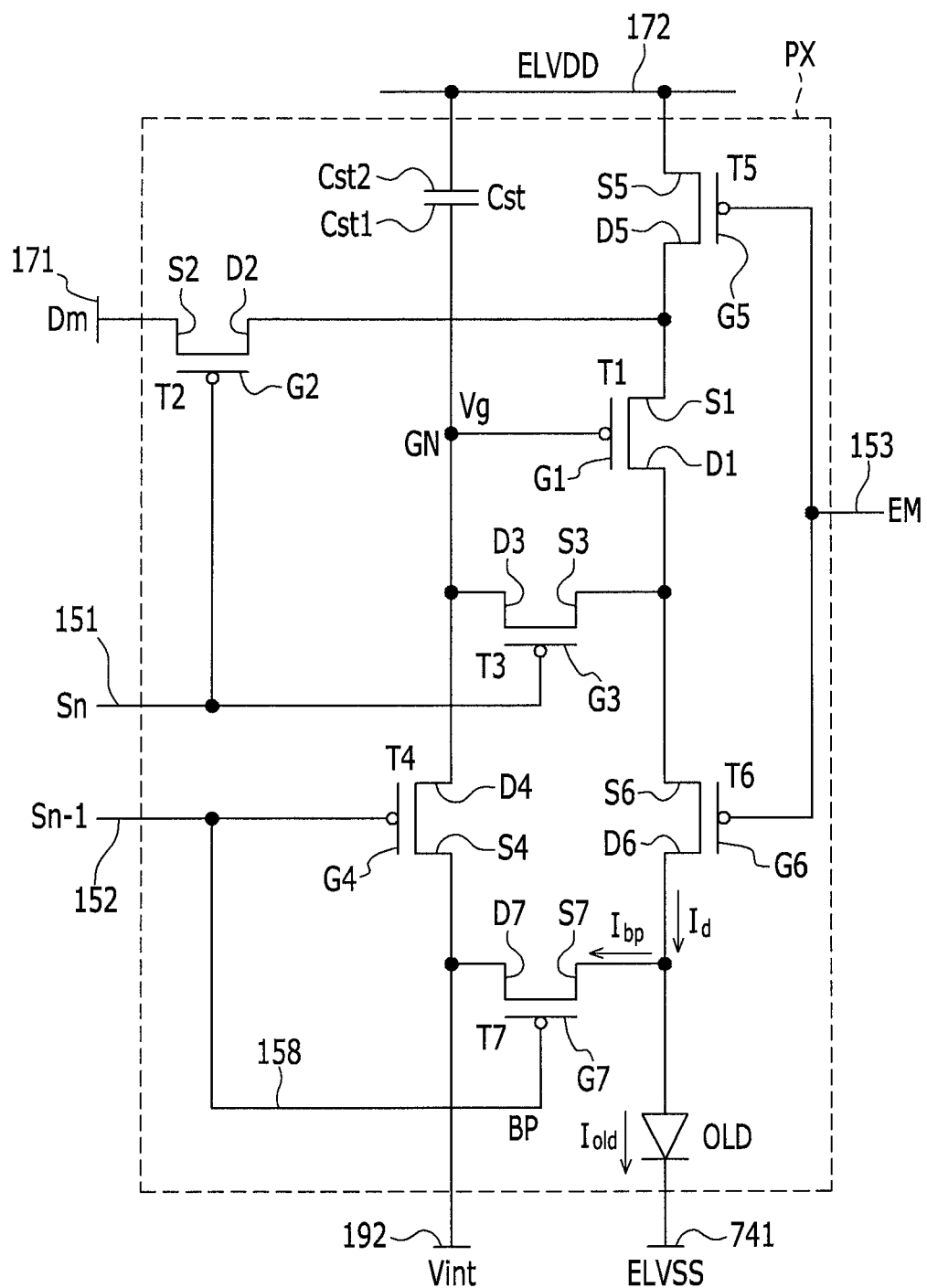
FIG. 1 is an equivalent circuit diagram of one pixel of an organic light emitting diode display according to an exemplary embodiment of the present disclosure.

The present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

The drawings and description are to be regarded as illustrative in nature and not restrictive. Like reference numerals designate like elements throughout the specification.

Further, because sizes and thicknesses of constituent members and/or layers shown in the accompanying drawings may be arbitrarily shown for better understanding and ease of description, the present disclosure is not limited thereto. In the drawings, the thickness of layers, films, panels, regions, etc., may be exaggerated for clarity.

It will be understood that when an element or layer is referred to as being "on", "connected to", or "coupled to" another element or layer, it may be directly on, connected, or coupled to the other element or layer or one or more intervening elements or layers may also be present. When an element is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. As used herein, the term "and/or" includes any and all combinations of one or more of the associated listed items. Further, the use of "may" when describing embodiments of the present invention relates to "one or more embodiments of the present invention". Expressions, such as "at least one of," when preceding a list of elements, modify the entire list of elements and do not modify the individual elements of the list. Also, the term "exemplary" is intended to refer to an example or illustration.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly. As used herein, the terms "use," "using," and "used" may be considered synonymous with the terms "utilize," "utilizing," and "utilized," respectively.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments. In the figures, dimensions of the various elements, layers, etc. may be exaggerated for clarity of illustration.

The terminology used herein is for the purpose of describing particular example embodiments only and is not intended to be limiting of example embodiments. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. In addition, driving devices or elements and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the driving devices may be formed on one integrated circuit (IC) chip or on separate IC chips. Further, the various components of the driving devices may be implemented on a flexible printed circuit film, a tape carrier package (TCP), a printed circuit board (PCB), or formed on a same substrate as the driving devices. Further, the various components of the driving devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

Further, in the specification, the phrase "in a plan view" means when a component, an object, or portion thereof is viewed from above, and the phrase "in a cross-section" means when a cross-section taken by vertically cutting a component, an object, or a portion thereof is viewed from the side.

Also, the present disclosure is not limited to the number of thin film transistors (TFT) and capacitors shown in the accompanying drawings, and in the organic light emitting diode display according to the present disclosure, each pixel may be include a plurality of transistors and at least one capacitor and may be formed to have various structures by further including additional wires or omitting existing wires. Throughout the specification, the pixel is a minimum unit for displaying an image, and the organic light emitting diode display displays the image through the plurality of pixels.

Hereinafter, an organic light emitting diode display according to exemplary embodiments of the present disclosure will be described with reference to accompanying drawings.

FIG. 1 is an equivalent circuit diagram of one pixel of an organic light emitting diode display according to an exemplary embodiment of the present disclosure.

As shown in FIG. 1, the organic light emitting diode display according to an exemplary embodiment of the present disclosure includes a plurality of signal lines 151, 152, 153, 158, 171, 172, and 192 and a plurality of pixels PX arranged in a matrix and connected to the plurality of signal lines.

One pixel PX includes a plurality of transistors T1, T2, T3, T4, T5, T6, and T7, a storage capacitor Cst, and an organic light emitting diode OLD that are connected to the plurality of signal lines 151, 152, 153, 158, 171, 172, and 192.

The transistors T1, T2, T3, T4, T5, T6, and T7 include a driving transistor T1, a switching transistor T2, a compensation transistor T3, an initialization transistor T4, an operation control transistor T5, a light emission control transistor T6, and a bypass transistor T7.

The signal lines 151, 152, 153, 158, 171, 172, and 192 include a scan line 151 transferring a scan signal Sn, a previous scan line 152 transferring a previous scan signal Sn−1 to the initialization transistor T4, a light emission control line 153 transferring a light emission control signal EM to the operation control transistor T5 and the light emission control transistor T6, a bypass control line 158 transferring a bypass signal BP to the bypass transistor T7, a data line 171 crossing the scan line 151 and transferring a data signal Dm, a driving voltage line 172 transferring a driving voltage ELVDD and formed to be (e.g., formed to extend) substantially parallel with the data line 171, and an initialization voltage line 192 transferring an initialization voltage Vint initializing the driving transistor T1.

A gate electrode G1 of the driving transistor T1 is connected with one end Cst1 of the storage capacitor Cst, a source electrode S1 of the driving transistor T1 is connected with the driving voltage line 172 via the operation control transistor T5, and a drain electrode D1 of the driving transistor T1 is connected (e.g., electrically connected) with an anode of the organic light emitting diode OLD via the light emission control transistor T6. The driving transistor T1 receives the data signal Dm according to a switching operation of the switching transistor T2 to supply a driving current Id to the organic light emitting diode OLD.

A gate electrode G2 of the switching transistor T2 is connected with the scan line 151, a source electrode S2 of the switching transistor T2 is connected with the data line 171, and a drain electrode D2 of the switching transistor T2 is connected with the source electrode S1 of the driving transistor T1 and with the driving voltage line 172 via the operation control transistor T5. The switching transistor T2 is turned on according to the scan signal Sn received through the scan line 151 to perform a switching operation of transferring the data signal Dm transferred by the data line 171 to the source electrode of the driving transistor T1.

A gate electrode G3 of the compensation transistor T3 is directly connected with the scan line 151, a source electrode S3 of the compensation transistor T3 is connected to the drain electrode D1 of the driving transistor T1 and with an anode of the organic light emitting diode OLED via the light emission control transistor T6, and a drain electrode D3 of the compensation transistor T3 is connected with one end Cst1 of the storage capacitor Cst, the drain electrode D4 of the initialization transistor T4 and the gate electrode G1 of the driving transistor T1. The compensation transistor T3 is turned on according to the scan signal Sn received through the scan line 151 to connect the gate electrode G1 and the drain electrode D1 of the driving transistor T1 to thereby diode-connect the driving transistor T1.

A gate electrode G4 of the initialization transistor T4 is connected with the previous scan line 152, a source electrode S4 of the initialization transistor T4 is connected with an initialization voltage line 192, and a drain electrode D4 of the initialization transistor T4 is connected with one end Cst1 of the storage capacitor Cst and the gate electrode G1 of the driving transistor T1 together through the drain electrode D3 of the compensation transistor T3. The initialization transistor T4 is turned on according to a previous scan signal Sn−1 received through the previous scan line 152 to transfer the initialization voltage Vint to the gate electrode G1 of the driving transistor T1 and then performs an initialization operation of initializing a voltage of the gate electrode G1 of the driving transistor T1.

A gate electrode G5 of the operation control transistor T5 is connected with the light emission control line 153, a source electrode S5 of the operation control transistor T5 is connected with the driving voltage line 172, and a drain electrode D5 of the operation control transistor T5 is connected with the source electrode S1 of the driving transistor T1 and the drain electrode S2 of the switching transistor T2.

A gate electrode G6 of the light emission control transistor T6 is connected to the light emission control line 153, the source electrode S6 of the first light emission control transistor T6 is connected to the drain electrode D1 of the driving transistor T1 and the source electrode S3 of the compensation transistor T3, and the drain electrode D6 of the first light emission control transistor T6 is electrically connected to the anode of the organic light emitting diode OLD. The operation control transistor T5 and the first light emission control transistor T6 are concurrently (e.g., simultaneously) turned on according to the light emission control signal EM transmitted to the light emission control line 153 such that the driving voltage ELVDD is compensated through the diode-connected driving transistor T1 and is transmitted to the organic light emitting diode OLD.

A gate electrode G7 of the thin film bypass transistor T7 is connected to the bypass control line 158, a source electrode S7 of the bypass thin film transistor T7 is connected to both the drain electrode D6 of the light emission control thin film transistor T6 and the anode of the organic light emitting diode OLED, and a drain electrode D7 of the bypass thin film transistor T7 is connected to both the initialization voltage line 192 and the source electrode S4 of the initialization thin film transistor T4.

The other end Cst2 of the storage capacitor Cst is connected with the driving voltage line 172, and a cathode of the organic light emitting diode OLED is connected with a common voltage line 741 transferring a common voltage ELVSS.

A 7-transistor and 1-capacitor structure including the bypass transistor T7 is described in an exemplary embodiment of the present disclosure; however, the present disclosure is not limited thereto, and a number of transistors and a number of capacitors may be suitably changed.

Hereinafter, a detailed operation process of one pixel of the organic light emitting diode display according to an exemplary embodiment of the present disclosure will be described in detail with reference to FIG. 2.

Figure 2:
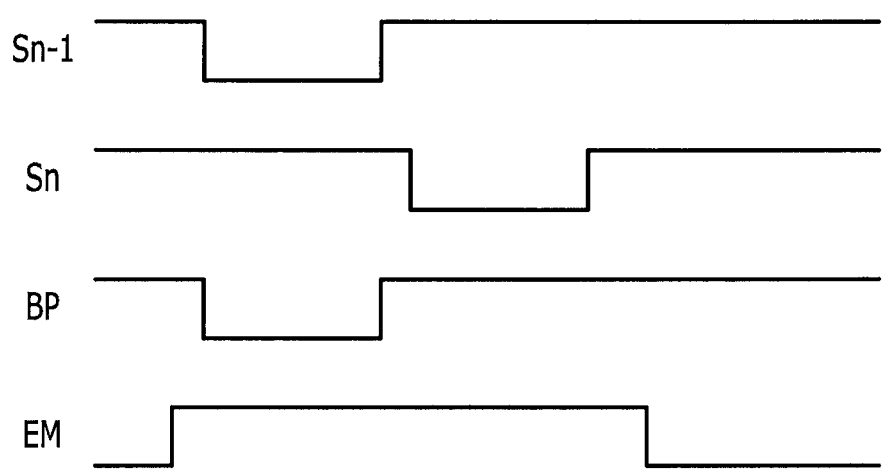
FIG. 2 is a timing diagram of a signal applied to one pixel of an organic light emitting diode display according to an exemplary embodiment of the present disclosure.

FIG. 2 is a timing diagram of signals applied to one pixel of an organic light emitting diode display according to an exemplary embodiment of the present disclosure.

As shown in FIG. 2, first, during an initializing period, the previous scan signal S(n−1) having a low level is supplied through the previous scan line 152. Then, the initializing thin film transistor T4 is turned on in response to the previous scan signal S(n−1) having the low level, the initial voltage Vint is connected to the gate electrode G1 of the driving transistor T1 from the initialization voltage line 178 through the initializing thin film transistor T4, and then the driving thin film transistor T1 is initialized by the initialization voltage Vint.

Thereafter, during a data programming period, the scan signal Sn having a low level is supplied through the scan line 151. Then, the switching thin film transistor T2 and the compensating thin film transistor T3 are turned on in response to the scan signal Sn having the low level. At this time, the driving transistor T1 is diode-connected through the turned-on compensation transistor T3 and is positively biased (e.g., is biased in a forward direction).

Then, a compensation voltage Dm+Vth (Vth is a negative (−) value), reduced by a threshold voltage Vth of the driving thin film transistor T1 from a data signal Dm supplied from the data line 171, is applied to the gate electrode G1 of the driving thin film transistor T1. For example, the gate voltage Vg applied to the gate electrode G1 of the driving transistor T1 becomes the compensation voltage (Dm+Vth).

The driving voltage ELVDD and the compensation voltage (Dm+Vth) are applied to respective terminals of the storage capacitor Cst, and a charge corresponding to a voltage difference between both terminals is stored in the storage capacitor Cst.

Next, during a light emission period, the light emission control signal EM supplied from the light emission control line 153 is changed from the high level to the low level. Accordingly, the operation control transistor T5 and the light emission control transistor T6 are turned on by the light emission control signal EM being at the low level during the light emission period.

Thus, a driving current Id is generated according to the voltage difference between the gate voltage of the gate electrode G1 of the driving transistor T1 and the driving voltage ELVDD, and the driving current Id is supplied to the organic light emitting diode OLD through the light emission control transistor T6. The gate-source voltage Vgs of the driving thin film transistor T1 is maintained as "(Dm+Vth)-ELVDD" by the storage capacitor Cst during the light emission period, and according to a current-voltage relationship of the driving thin film transistor T1, the driving current Id is proportional to the square "(Dm-ELVDD)$^2$" of a value obtained by subtracting the threshold voltage from the source-gate voltage. Accordingly, the driving current Id is provided regardless of the threshold voltage Vth of the driving thin film transistor T1.

In this embodiment, the bypass transistor T7 is turned on based on (e.g., according to) the bypass signal BP from the bypass control line 158. Thus, a portion of the driving current Id is discharged as the bypass current Ibp through the bypass transistor T7.

When a minimum current of the driving transistor T1 for displaying a black image flows (e.g., is transmitted) as the driving current and the organic light emitting diode (OLED) is emitting, the black image is not normally displayed (e.g., is not properly displayed). Accordingly, the bypass transistor T7 of the organic light emitting diode display according to an exemplary embodiment of the present disclosure may disperse a portion of the minimum current of the driving transistor T1 as the bypass current Ibp through another current path other than the current path of the organic light emitting diode. In one embodiment, the minimum current of the driving transistor T1 is a current in a condition that the driving transistor T1 is turned off as the gate-source voltage Vgs of the driving transistor T1 is less than the threshold voltage Vth. The minimum driving current (e.g., a current of 10 pA or less) under the condition in which the driving transistor T1 is turned off is transferred to the organic light emitting diode OLD to be expressed as an image having black luminance (e.g., the black image). When the minimum driving current for expressing the black image flows, an influence on a bypass transfer of the bypass current Ibp is relatively large, but when a large driving current expressing an image, such as a normal image or a white image, flows, there may be relatively little influence on the bypass current Ibp. Accordingly, when the driving current displaying the black image flows, a light emission current Ioled of the organic light emitting diode OLD, which is reduced by the current amount of the bypass current Ibp which flows from the driving current Id through the bypass transistor T7, has a minimum current amount which may precisely (e.g., exactly) express the black image. Therefore, a black luminance image is precisely (e.g., exactly) displayed by using the bypass transistor T7, thereby improving a contrast ratio.

In FIG. 2, the bypass signal BP is the same or substantially the same as a next scan signal S(n+1) but is not necessarily limited thereto.

Next, a detailed structure of the organic light emitting diode display shown in FIG. 1 and FIG. 2 will be further described with reference to FIG. 3, FIG. 4, FIG. 5, FIG. 6, and FIG. 7.

Figure 3:
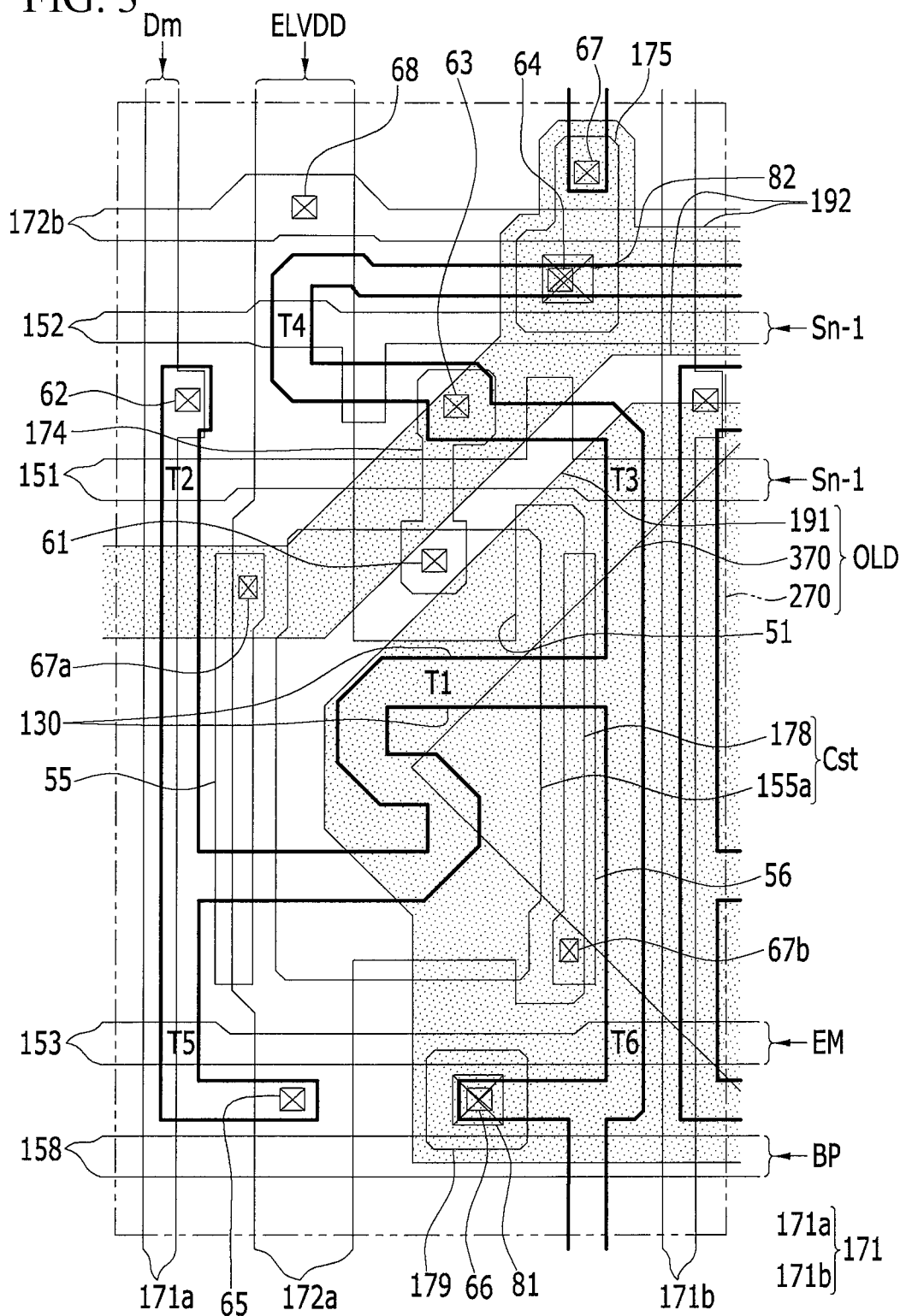
FIG. 3 is a schematic view of a plurality of transistors and a capacitor of an organic light emitting diode display according to an exemplary embodiment of the present disclosure.
Figure 4:
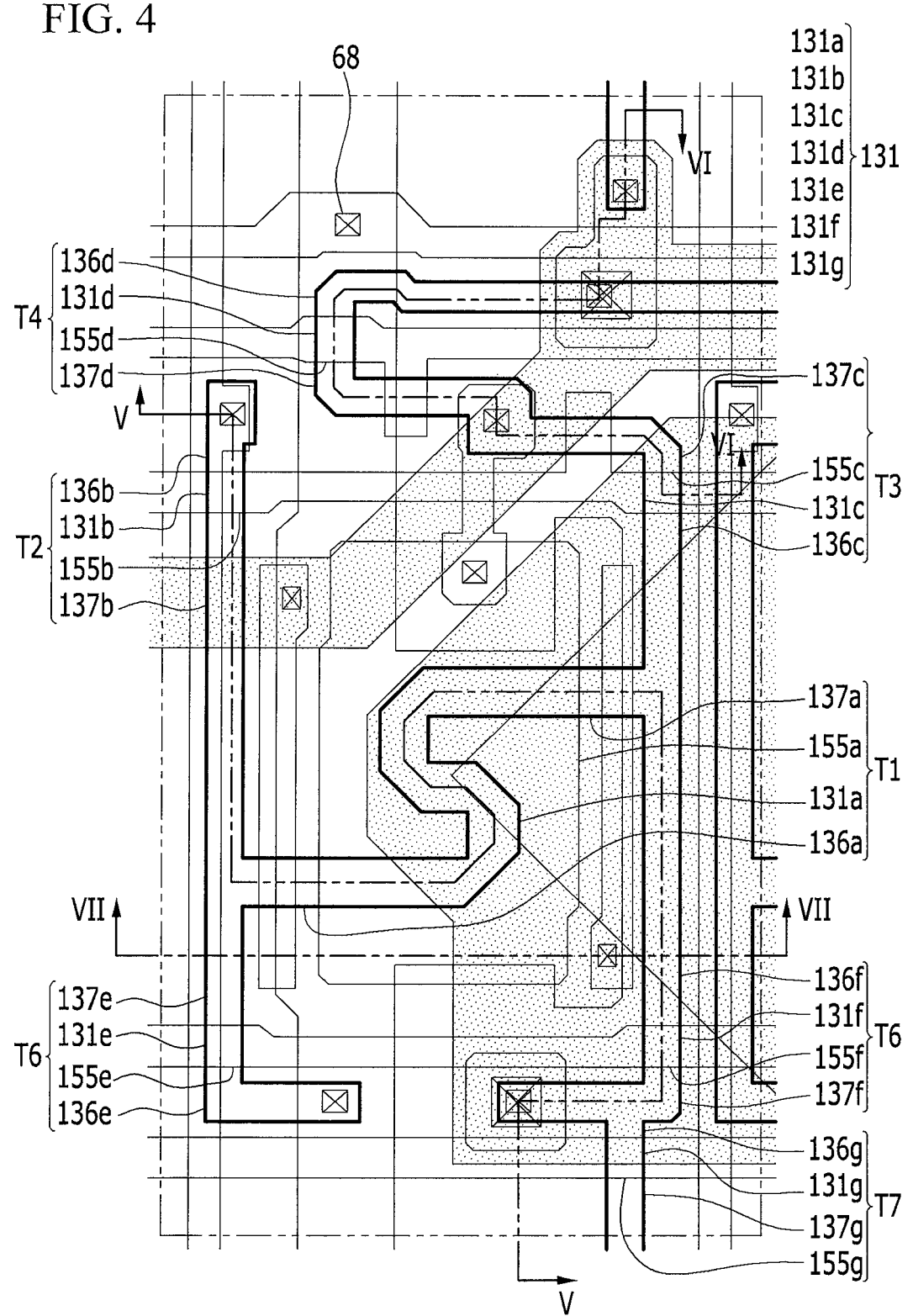
FIG. 4 is a detailed layout view of FIG. 3.
Figure 5:
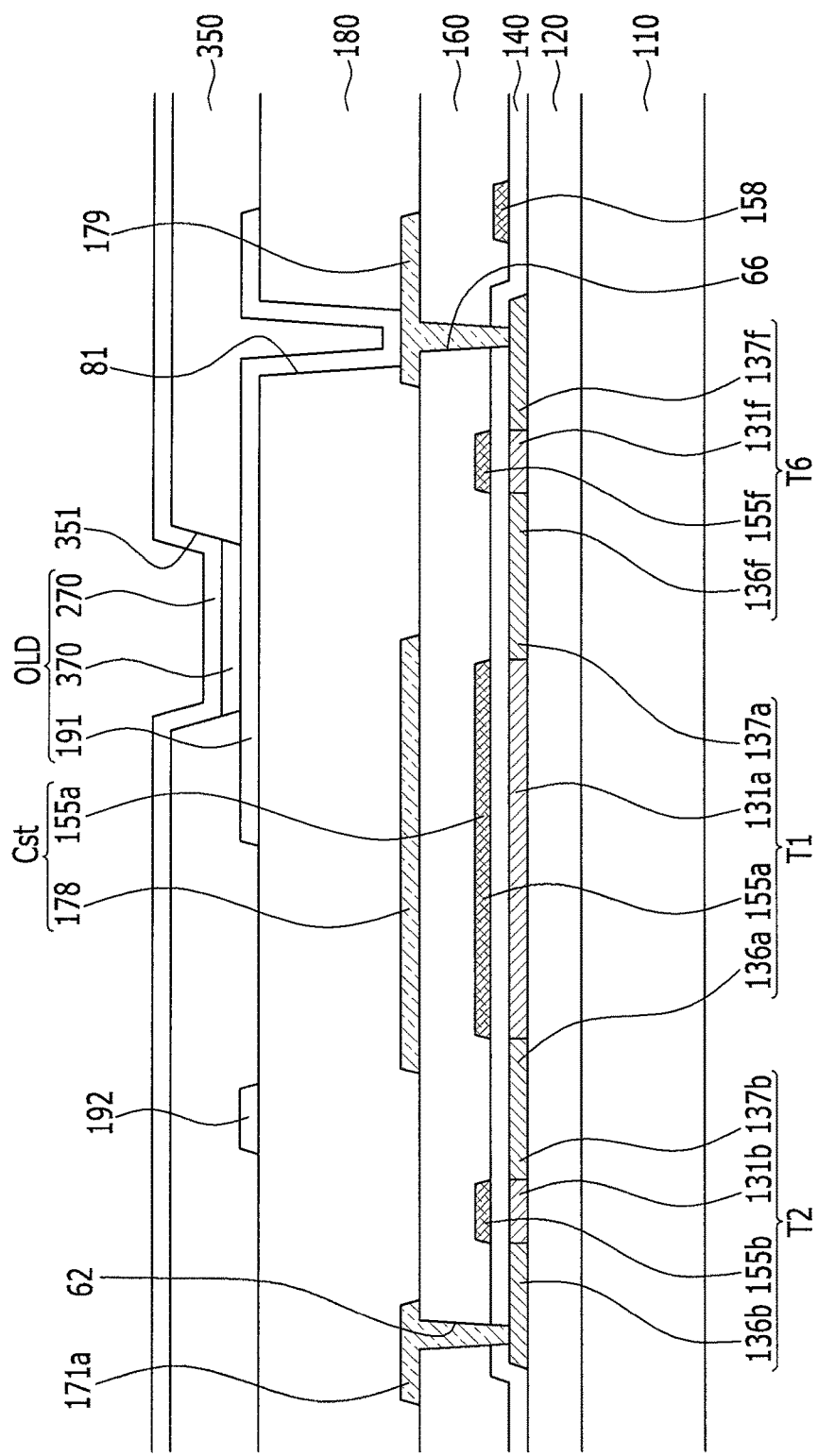
FIG. 5 is a cross-sectional view of the organic light emitting diode display illustrated in FIG. 4 taken along the line V-V of FIG. 4.
Figure 6:
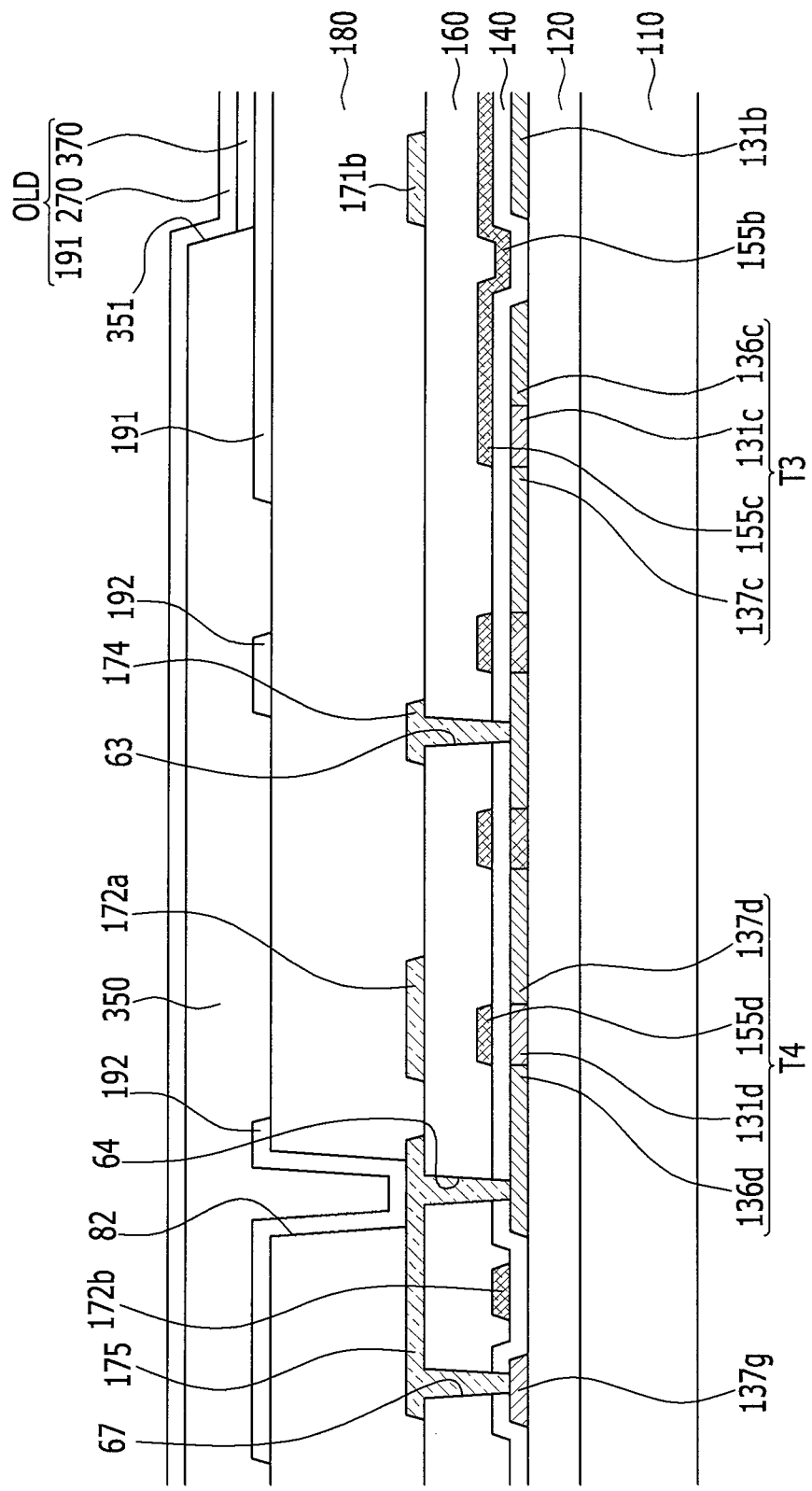
FIG. 6 is a cross-sectional view of the organic light emitting diode display illustrated in FIG. 4 taken along the line VI-VI of FIG. 4.
Figure 7:
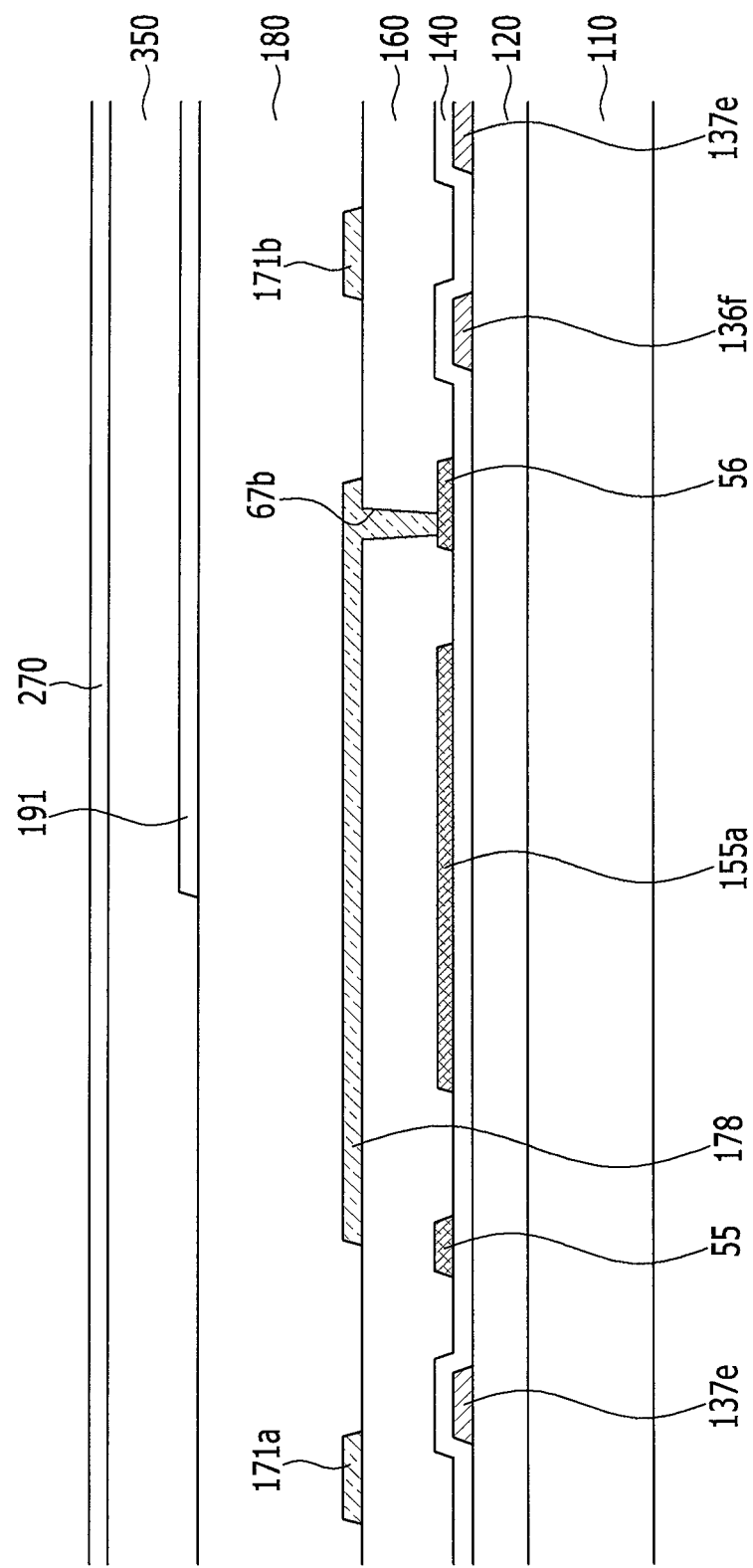
FIG. 7 is a cross-sectional view of the organic light emitting diode display illustrated in FIG. 4 taken along the line VII-VII of FIG. 4.

FIG. 3 is a schematic view of a plurality of transistors and a capacitor of an organic light emitting diode display according to an exemplary embodiment of the present disclosure, FIG. 4 is a detail layout view of FIG. 3, FIG. 5 is a cross-sectional view of the organic light emitting diode display illustrated in FIG. 4 taken along the line V-V of FIG. 4, FIG. 6 is a cross-sectional view of the organic light emitting diode display illustrated in FIG. 4 taken along the line VI-VI of FIG. 4, and FIG. 7 is a cross-sectional view of the organic light emitting diode display illustrated in FIG. 4 taken along the line VII-VII of FIG. 4.

Hereinafter, a detailed structure of the organic light emitting diode display according to an exemplary embodiment of the present disclosure will be first described in further detail with reference to FIG. 3 and FIG. 4, and a detailed cross-sectional structure thereof will be described in more detail with reference to FIG. 5, FIG. 6, and FIG. 7.

As shown in FIG. 3 and FIG. 4, a pixel PX of the organic light emitting diode display according to an exemplary embodiment of the present disclosure includes a scan line 151, a previous scan line 152, an emission control line 153, and a bypass control line 158 respectively transmitting a scan signal Sn, a previous scan signal Sn−1, an emission control signal EM, and a bypass signal BP to the pixel PX, and the scan line 151, the previous scan line 152, the emission control line 153, and the bypass control line 158 are formed to extend along a row direction. The pixel PX further includes a data line 171, a driving voltage line 172, and an initialization voltage line 178 respectively applying a data signal Dm, a driving voltage ELVDD, and an initialization voltage Vint to the pixel PX. The data line 171 and the initialization voltage line 178 cross the scan line 151, the previous scan line 152, the emission control line 153, and the bypass control line 158. The driving voltage line 172 includes a first driving voltage line 172a parallel to the data line 171 and a second driving voltage line 172b parallel to the scan line 151. The first driving voltage line 172a and the second driving voltage line 172b are connected via (e.g., through) a contact opening 68 (e.g., a contact hole).

Further, a driving thin film transistor T1, a switching thin film transistor T2, a compensation thin film transistor T3, an initialization thin film transistor T4, an operation control thin film transistor T5, an emission control thin film transistor T6, a bypass thin film transistor T7, a storage capacitor Cst, and an organic light emitting diode OLD are formed in the pixel PX.

The initialization voltage Vint is transmitted from the initialization voltage line 192 through the initialization transistor T4 to the compensation transistor T3. The initialization voltage line 192 is formed to alternately have a straight portion and an oblique portion.

The organic light emitting diode OLD includes a pixel electrode 191, an organic emission layer 370, and a common electrode 270. In this embodiment, the compensation transistor T3 and the initialization transistor T4 are dual gate structure transistors in order to reduce or block leakage current.

Channels of the driving transistor T1, the switching transistor T2, the compensation transistor T3, the initialization transistor T4, the operation control transistor T5, the light emission control transistor T6, and the bypass transistor T7 are formed with a semiconductor 130 connected thereto, and the semiconductor 130 may be formed to be curved in various shapes. The semiconductor 130 may be made of a polycrystalline semiconductor material or an oxide semiconductor material. The oxide semiconductor material may include an oxide based on (e.g., an oxide including) titanium (Ti), hafnium (Hf), zirconium (Zr), aluminum (Al), tantalum (Ta), germanium (Ge), zinc (Zn), gallium (Ga), tin (Sn), or indium (In), and/or a compound oxide, such as indium-gallium-zinc oxide ($InGaZnO_4$), indium-zinc oxide (Zn—In—O), zinc tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), or hafnium-indium-zinc oxide (Hf—In—Zn—O). In an embodiment in which the semiconductor 130 includes the oxide semiconductor material, a separate passivation layer for protecting the oxide semiconductor material which is vulnerable to an external environment, such as high temperature, may be included.

The semiconductor 130 includes a channel, which is doped with an N-type impurity or a P-type impurity, and a source doping part and a drain doping part which are formed at respective sides of the channel and doped with an opposite-type doping impurity as that of the doping impurity doped on the channel. In one exemplary embodiment, the source doping part and the drain doping part correspond to the source electrode and the drain electrode, respectively. The source electrode and the drain electrode formed in the semiconductor 130 may be formed by doping only the corresponding regions. Further, in the semiconductor 130, a region between source electrodes and drain electrodes of different transistors is doped and, thus, the source electrode and the drain electrode may be electrically connected to each other.

As illustrated in FIG. 4, the channel 131 includes a driving channel 131*a* formed in the drive transistor T1, a switching channel 131*b* formed in the switching transistor T2, a compensation channel 131*c* formed in the compensation transistor T3, an initialization channel 131*d* formed in the initialization transistor T4, an operation control channel 131*e* formed in the operation control transistor T5, a light emission control channel 131*f* formed in the light emission control transistor T6, and a bypass channel 131*g* formed in the bypass transistor T7.

The driving transistor T1 includes the driving channel 131*a*, a driving gate electrode 155*a*, a driving source electrode 136*a*, and a driving drain electrode 137*a*. The driving channel 131*a* is curved and may have a meandering shape or a zigzag shape. Due to the curved driving channel 131*a*, the driving channel 131*a* may be formed to be elongated in a narrow space (e.g., the driving channel 131*a* may be formed to be relatively long in a relatively small area). Accordingly, a driving range of the driving gate-source voltage Vgs between the driving gate electrode 155*a* and the driving source electrode 136*a* is increased due to the elongated driving channel 131*a*. Because the driving range of the gate voltage is increased, a gray scale of light emitted from the organic light emitting diode OLD may be more finely controlled by changing the magnitude of the gate voltage, and as a result, the resolution of the organic light emitting diode display device may be enhanced and display quality may be improved. The driving channel 131*a* may be formed to have various suitable shapes, such as a 'reverse S', 'S', 'M', or 'W'.

The driving gate electrode 155*a* overlaps with the driving channel 131*a*, and the driving source electrode 136*a* and the driving drain electrode 137*a* are formed at respective sides of the driving channel 131*a* to be relatively close to each other. The driving gate electrode 155*a* is connected to the first data connecting member 174 via (e.g., through) a contact opening 61 (e.g., a contact hole).

The switching transistor T2 includes the switching channel 131*b*, a switching gate electrode 155*b*, a switching source electrode 136*b*, and a switching drain electrode 137*b*. The switching gate electrode 155*b* is a part of the scan line 121 extended downward therefrom and overlaps with the switching channel 131*b*. The switching source electrode 136*b* and the switching drain electrode 137*b* are formed at respective sides of the switching channel 131*b* to be relatively close to each other. The switching source electrode 136*b* is connected with the data line 171 via (e.g., through) a contact opening 62 (e.g., a contact hole).

The compensation transistor T3 includes the compensation channel 131*c*, a compensation gate electrode 155*c*, a compensation source electrode 136*c*, and a compensation drain electrode 137*c*. The compensation gate electrode 155*c*, that is a part of the scan line 151, is formed having a two gate structure to reduce or prevent leakage current and overlaps the compensation channel 131*c*. The compensation source electrode 136*c* and the compensation drain electrode 137*c* are formed to be adjacent to respective sides of the compensation channel 131*c*. The compensation drain electrode 137*c* is connected to a first data connecting member 174 via (e.g., through) a contact opening 63 (e.g., a contact hole).

The initialization transistor T4 includes the initialization channel 131*d*, an initialization gate electrode 155*d*, an initialization source electrode 136*d*, and an initialization drain electrode 137*d*. The initialization gate electrode 155*d*, that is a part of the previous scan line 152, is formed having a two gate structure to reduce or prevent leakage current and overlaps the initialization channel 131*d*. The initialization source electrode 136*d* and the initialization drain electrode 137*d* are formed to be adjacent to respective sides of the initialization channel 131*d*. The initialization source electrode 136*d* is connected to a second data connecting member 175 via (e.g., through) a contact opening 64 (e.g., a contact hole).

The operation control transistor T5 includes the operation control channel 131*e*, an operation control gate electrode 155*e*, an operation control source electrode 136*e*, and an operation control drain electrode 137*e*. The operation control gate electrode 155e, that is a part of the light emission control line 153, overlaps the operation control channel 131e. The operation control source electrode 136e and the operation control drain electrode 137e are formed to be adjacent to respective sides of the operation control channel 131e. The operation control source electrode 136e is connected to a part of the driving voltage line 172 which extends therefrom via (e.g., through) a contact opening 65 (e.g., a contact hole).

The light emission control transistor T6 includes the light emission control channel 131f, a light emission control gate electrode 155f, a light emission control source electrode 136f, and a light emission control drain electrode 137f. The light emission control gate electrode 155f, that is a part of the light emission control line 153, overlaps the light emission control channel 131f. The light emission control source electrode 136f and the light emission control drain electrode 137f are formed to be adjacent to respective sides of the light emission control channel 131f. The light emission control drain electrode 137f is connected to the third data connecting member 179 via (e.g., through) a contact opening 66 (e.g., a contact hole).

The bypass transistor T7 includes the bypass channel 131g, a bypass gate electrode 155g, a bypass source electrode 136g, and a bypass drain electrode 137g. The bypass gate electrode 155g, that is a part of the bypass control line 158, overlaps the bypass channel 131g. The bypass source electrode 136g and the bypass drain electrode 137g are formed to be adjacent to respective sides of the bypass channel 131g.

The bypass source electrode 136g is connected directly to the light emission control drain electrode 137f, and the bypass drain electrode 137g is connected directly to the initialization source electrode 136d.

One end of the driving channel 131a of the driving transistor T1 is connected to the switching drain electrode 137b and the operation control drain electrode 137e, and the other end of the driving channel 131a is connected to the compensation source electrode 136c and the light emission control source electrode 136f.

The storage capacitor Cst includes a first storage electrode 155a and a second storage electrode 178 (i.e., the initialization voltage line 178) with a second gate insulating layer 142 interposed therebetween. The first storage electrode 155a corresponds to the driving gate electrode 155a, and the second storage electrode 178 is an expanded region of the first driving voltage line 172a and is formed one by one in each pixel (e.g., one second storage electrode 178 is formed in each pixel). In one embodiment, the gate insulating layer 142 is a dielectric material, and a storage capacitance is determined by a charge charged to the storage capacitor Cst and a voltage between the electrodes 155a and 156. As described above, by using the driving gate electrode 155a as the first storage electrode 155a, the storage capacitor may be formed in a space that is occupied by the driving channel 131a, which occupies a relatively large area of the pixel PX.

The first storage electrode 155a as the driving gate electrode 155a is connected to one end of the driving connecting member 174 (i.e., the first data connecting member 174) via the contact opening 61 and a storage groove 51. The storage groove 51 is a groove formed in the second storage electrode 178. Accordingly, the contact opening 61 connecting one end of the driving connecting member 174 and the driving gate electrode 155a is formed in the storage groove 51. The driving connecting member 174 is substantially parallel to the data line 171 and is formed on the same layer, and the other end of the driving connecting member 174 is connected to the compensation drain electrode 137c of the compensation transistor T3 and the initialization drain electrode 137d of the initialization transistor T4 via (e.g., through) the contact opening 63. Accordingly, the driving connecting member 174 connects the driving gate electrode 155a and the compensation drain electrode 137c of the compensation transistor T3 and the initialization drain electrode 137d of the initialization transistor T4 to each other. The driving connecting member 174 corresponds to a driving gate node GN in the equivalent circuit diagram of FIG. 1.

The second storage electrode 178 is an expanded area extended from the first driving voltage line 172a. Accordingly, the storage capacitor Cst stores the storage capacitance corresponding to a difference between the driving voltage ELVDD transmitted to the second storage electrode 178 through the driving voltage line 172 and the gate voltage Vg of the driving gate electrode 155a.

The data line 171 crosses the scan line 151 and extends along a column direction, and the driving voltage line 172 is spaced from the data line 171 and extends along the column direction.

Shielding members 55 and 56 are disposed between the driving connecting member 174 and the data line 171. The data line 171 includes the first data line 171a transmitting the data signal Dm to the presently-described pixel and the second data line 171b transmitting a next data signal D(m+1) to an adjacent pixel. The first data line 171a and the second data line 171b are formed to be adjacent to each other. The shielding members 55 and 56 include a first shielding member 55 positioned between the driving connecting member 174 and the first data line 171a and a second shielding member 56 positioned between the driving connecting member 174 and the second data line 171b. The shielding members 55 and 56 overlap a portion of the second storage electrode 178.

The first shielding member 55 is connected to the second storage electrode 178 via (e.g., through) a first shielding connection opening 67a (e.g., a first shielding connection hole), and the second shielding member 56 is connected to the second storage electrode 178 via (e.g., through) a second shielding connection opening 67b (e.g., a second shielding connection hole).

A parasitic capacitance Ca is generated between the data line 171 and the driving connecting member 174, and the parasitic capacitance Ca affects the transmittance of the data signal Dm and the next data signal D(m+1) of the data line 171 to the driving connecting member 174. Accordingly, the driving gate voltage Vg of the driving gate electrode 155a, which is connected to the driving connecting member 174, is changed, thereby affecting the luminance and generating vertical crosstalk.

However, in an exemplary embodiment of the present disclosure, the shielding members 55 and 56 connected to the second storage electrode 178, which is a portion of the first driving voltage line 172a applied with the driving voltage ELVDD, are positioned between the driving connecting member 174 and the data line 171. Accordingly, the shielding members 55 and 56 reduce or block the driving connecting member 174 and the data line 171 from communicating with or affecting (e.g., electromagnetically affecting) each other, thereby reducing or preventing parasitic capacitance between the driving connecting member 174 and the data line 171.

Accordingly, kickback voltage due to parasitic capacitance is reduced or minimized such that a change of the driving gate voltage (Vg) of the driving gate electrode 155a connected to the connecting member 174 as the driving gate node GN is reduced, thereby reducing or minimizing vertical crosstalk.

Also, the data voltage Dm may be increased by reducing or minimizing kickback voltage due to parasitic capacitance such that a driving range of the driving gate-source voltage Vgs between the driving gate electrode 155*a* connected to the driving connecting member 174 and the driving source electrode 136*a* may be increased (e.g., widened). Accordingly, a light (e.g., a gray light) emitted from the organic light emitting diode OLD may be more finely controlled, and as a result, a resolution of the organic light emitting diode display may be enhanced and display quality may be improved.

The second driving voltage line 172*b* is connected to the first driving voltage line 172*a* via (e.g., through) the contact opening 68. Accordingly, the driving voltage line 172 may be formed having a mesh structure in which the first driving voltage line 172*a* which extends along a vertical direction (e.g., the column direction) and the second driving voltage line 172*b* which extends along a horizontal direction (e.g., the row direction) are connected to each other, thereby reducing or preventing voltage drop of the driving voltage ELVDD.

The light emission control connecting member 179 having a quadrangle shape is connected to the pixel electrode 191 via (e.g., through) a contact opening 81 (e.g., a contact hole), and the initialization connecting member 175 having a quadrangle shape is connected to the initialization voltage line 192 via (e.g., through) a contact opening 82 (e.g., a contact hole).

Hereinafter, the cross-sectional structures of the organic light emitting diode display device according to an exemplary embodiment of the present disclosure will be described in more detail with reference to FIG. 5, FIG. 6, and FIG. 7.

In one embodiment, because the stacked structure of the operation control transistor T5 is substantially the same as that of the light emission control transistor T6, a detailed description thereof may be omitted.

A buffer layer 120 may be formed on an insulating substrate 110. The insulating substrate 110 may be formed of an insulating material, such as glass, crystal, ceramic, or plastic. The buffer layer 120 blocks impurities from the insulating substrate 110 during a crystallization process for forming a polycrystalline semiconductor to improve characteristics of the polycrystalline semiconductor and reduce stress applied to the insulating substrate 110. The buffer layer 120 may be formed of silicon nitride ($SiN_x$) and/or silicon oxide ($SiO_x$).

The semiconductor 130, including the driving channel 131*a*, the switching channel 131*b*, the compensation channel 131*c*, the initialization channel 131*d*, the operation control channel 131*e*, the light emission control channel 131*f*, and the bypass channel 131*g*, is formed on the buffer layer 120. A driving source electrode 136*a* and a driving drain electrode 137*a* are formed at respective sides of the driving channel 131*a* of the semiconductor 130, and a switching source electrode 136*b* and a switching drain electrode 137*b* are formed at respective sides of the switching channel 131*b*. The compensation source electrode 136*c* and the compensation drain electrode 137*c* are formed at respective sides of the compensation channel 131*c*, and the initialization source electrode 136*d* and the initialization drain electrode 137*d* are formed at respective sides of the initialization channel 131*d*. Also, the operation control source electrode 136*e* and the operation control drain electrode 137*e* are formed at respective sides of the operation control channel 131*e*, and the light emission control source electrode 136*f* and the light emission control drain electrode 137*f* are formed at respective sides of the light emission control channel 131*f*. Further, the bypass source electrode 136*g* and the bypass drain electrode 137*g* are formed at respective sides of the bypass channel 131*g*.

A gate insulating layer 140 covering the semiconductor 130 is formed thereon. A driving gate electrode 155*a*, shielding members 55 and 56, a switching gate electrode 155*b*, a scan line 151 including a compensation a gate electrode 155*c*, a previous scan line 152 including an initialization gate electrode 155*d*, an emission control line 153 including an operation control gate electrode 155*e* and an emission control gate electrode 155*f*, a bypass control line 158 including a bypass gate electrode 155*g*, and a driving gate electrode 155*a* (i.e., a first storage electrode 155*a*) are formed on the gate insulating layer 140. Each of components 151, 152, 153, 158, 155*a*, 55, and 56 may be formed having a multilayer structure in which a metal layer including copper (Cu), a copper alloy, aluminum (Al), an aluminum alloy, molybdenum (Mo), and/or a molybdenum alloy is deposited.

An interlayer insulating layer 160 covering the components 151, 152, 153, 158, 155*a*, 55, and 56 and the gate insulating layer 140 is formed thereon. The interlayer insulating layer 160 may be formed of silicon nitride ($SiN_x$) and/or silicon oxide ($SiO_x$).

The interlayer insulating layer 160 has contact openings 61, 62, 63, 64, 65, 66, 67, 67*a*, 67*b*, and 68 (e.g., contact holes). A data line 171, a driving voltage line 172 including a second storage electrode 178, a driving connecting member 174, an initialization connecting member 175 (i.e., a second data connecting member 175), and an emission control connecting member 179 are formed on the interlayer insulating layer 160. The components 171, 172, 174, 175, 178, and 179 may be formed having a multilayer structure in which a metal layer including copper (Cu), a copper alloy, aluminum (Al), an aluminum alloy, molybdenum (Mo), and/or a molybdenum alloy is deposited, or may be formed having a triple layer structure, such as titanium/aluminum/titanium (Ti/Al/Ti), molybdenum/aluminum/molybdenum (Mo/Al/Mo), or molybdenum/copper/molybdenum (Mo/Cu/Mo).

The data line 171 is connected to the switching source electrode 136*b* via (e.g., through) the contact opening 62 formed in the gate insulating layer 140 and the interlayer insulating layer 160, and the second storage electrode 178 is an expanded portion of the first driving voltage line 172*a*.

The shielding members 55 and 56, connected to the second storage electrode 178, are positioned between the driving connecting member 174 and the data line 171. Accordingly, the shielding members 55 and 56 transmitting the driving voltage block the driving connecting member 174 and the data line 171 from each other, thereby reducing or preventing parasitic capacitance between the driving connecting member 174 and the data line 171.

One end of the driving connecting member 174 is connected to the first storage electrode 155*a* via (e.g., through) the contact opening 61 formed in the interlayer insulating layer 160, and the other end of the driving connecting member 174 is connected to the compensation drain electrode 137*c* and the initialization drain electrode 137*d* via (e.g., through) the contact opening 63 formed in the gate insulating layer 140 and the interlayer insulating layer 160.

One end of the initialization connecting member 175 is connected to the initialization source electrode 136*d* via the contact opening 64 formed in the gate insulating layer 140 and the interlayer insulating layer 160, the other end of the initialization connecting member 175 is connected to the bypass drain electrode 137g via the contact opening 67 formed in the gate insulating layer 140 and the interlayer insulating layer 160. Also, the light emission control connecting member 179 is connected to the light emission control drain electrode 137f via the contact opening 66 formed in the gate insulating layer 140 and the interlayer insulating layer 160.

A passivation layer 180 is formed to cover the components 171, 172, 174, 175, 178, and 179 and the interlayer insulating layer 160. The passivation layer 180 covers the components 171, 172, 174, 175, 178, and 179 and provides a planar upper surface, such that a pixel electrode 191 is formed on the passivation layer 180 without a step. The passivation layer 180 may be formed of an organic material, such as a polyacryl-based resin, a polyimide-based resin, or a deposition layer of the organic material and/or an inorganic material.

The pixel electrode 191 and an initialization voltage line 192 are formed on the passivation layer 180. The light emission control connecting member 179 is connected to the pixel electrode 191 via the contact opening 81 formed in the passivation layer 180, and the initialization connecting member 175 is connected to the initialization voltage line 192 via the contact opening 82 formed in the passivation layer 180.

A pixel definition layer PDL 350 is formed on the passivation layer 180, the initialization voltage line 192, and an edge of the pixel electrode 191. The pixel definition layer 350 has a pixel opening 351 exposing the pixel electrode 191. The pixel definition layer 350 may be made of an organic material, such as a polyacrylate resin and a polyimide resin, or of silica-series inorganic material (e.g., an inorganic material including silica).

An organic emission layer 370 is formed on the pixel electrode 191 exposed by the pixel opening 351, and a common electrode 270 is formed on the organic emission layer 370. The common electrode 270 is formed on the pixel defined layer 350 and is formed to cover the plurality of pixels PX (e.g., the common electrode 270 is formed as a common layer in or through each of the plurality of pixels PX). As such, an organic light emitting diode OLD is formed which includes the pixel electrode 191, the organic emission layer 370, and the common electrode 270.

In this embodiment, the pixel electrode 191 is an anode which is a hole injection electrode, and the common electrode 270 is a cathode which is an electron injection electrode. However, the present disclosure is not necessarily limited thereto, and the pixel electrode 191 may be the cathode and the common electrode 270 may be the anode according to a driving method of the organic light emitting diode display. Holes and electrons are injected into the organic emission layer 370 from the pixel electrode 191 and the common electrode 270, respectively, and excitons formed by combining the injected holes and electrons fall from an excitation state to a ground state, thereby emitting light.

The organic emission layer 370 is made of a low-molecular weight organic material or a high-molecular weight organic material, such as poly(3,4-ethylenedioxythiophene) (PEDOT). Further, the organic emission layer 370 may be formed with multiple layers including an emission layer, a hole injection layer (HIL), a hole transporting layer (HTL), an electron transporting layer (ETL), and/or an electron injection layer (EIL). When the organic emission layer 370 includes each of the above-described layers, the hole injection layer is disposed on the pixel electrode 191, which is the positive electrode, and the hole transporting layer, the light emission layer, the electron transporting layer, and the electron injection layer are sequentially laminated thereon.

The organic emission layer 370 may include a red organic emission layer emitting red light, a green organic emission layer emitting green light, and/or a blue organic emission layer emitting blue light. The red organic emission layer, the green organic emission layer, and the blue organic emission layer are formed at a red pixel, a green pixel, and a blue pixel, respectively, to implement color images.

In another embodiment, each of the red organic emission layer, the green organic emission layer, and the blue organic emission layer may be laminated together as the organic emission layer 370 in each of the red pixel, the green pixel, and the blue pixel, and, in this embodiment, one of a red color filter, a green color filter, and a blue color filter is formed for (e.g., formed over the light emitting portion of) each pixel to implement the color images. As another example, a white organic emission layer emitting white light may be formed in each of the red pixel, the green pixel, and the blue pixel, and, in this embodiment, one of the red color filter, the green color filter, and the blue color filter is formed for each pixel to implement the color images. When the color images are implemented by using the white organic emission layer and the color filters, a deposition mask for depositing the red organic emission layer, the green organic emission layer, and the blue organic emission layer on individual pixels, that is, the red pixel, the green pixel, and the blue pixel, respectively, may not be necessary.

The white organic emission layer emitting white light described in another example may be formed by one (e.g., a single) organic emission layer, or may be formed by laminating a plurality of organic emission layers. As some examples, the white organic emission layer may include a configuration that enables the white light to be emitted by combining a yellow organic emission layer and a blue organic emission layer, a configuration that enables the white light to be emitted by combining a cyan organic emission layer and a red organic emission layer, a configuration that enables the white light to be emitted by combining a magenta organic emission layer and a green organic emission layer, and/or the like.

An encapsulation member protecting the organic light emitting diode OLD may be formed on the common electrode 270. The encapsulation member may be sealed to the substrate 110 by a sealant and may be formed of various materials, such as glass, quartz, ceramic, plastic, or a metal. In another embodiment, a thin film encapsulation layer may be formed on the common electrode 270 by depositing an inorganic layer and/or an organic layer and may be sealed to the substrate 110 by the sealant.

In an exemplary embodiment of the present invention, the shielding members are positioned between the driving connecting member and the data line to prevent parasitic capacitance therebetween; however, in another embodiment, a distance between the data line and the driving connecting member may be increased to reduce or minimize parasitic capacitance therebetween.

Next, an organic light emitting diode display according to another exemplary embodiment of the present disclosure will be described with reference to the accompanying drawings.

Figure 8:
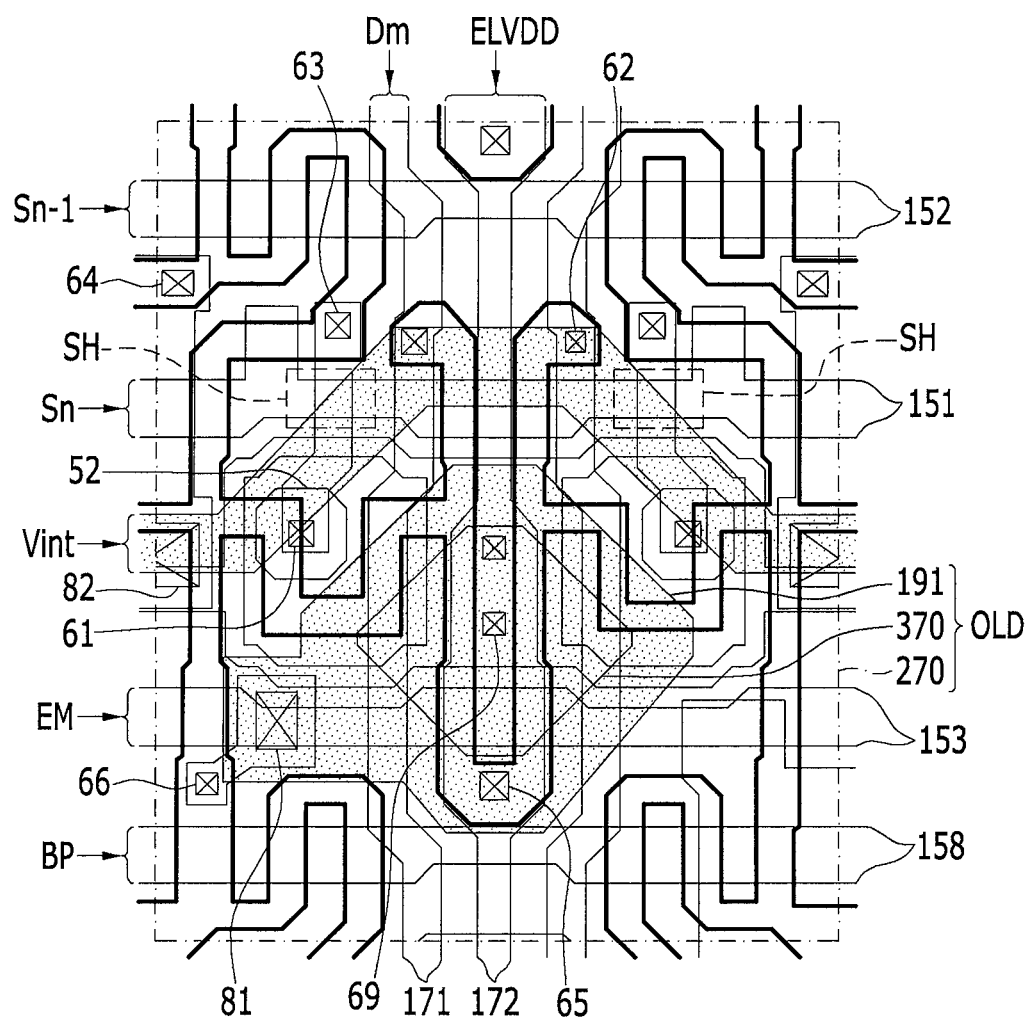
FIG. 8 is a view of a plurality of transistors and a capacitor of an organic light emitting diode display according to another exemplary embodiment of the present disclosure.
Figure 9:
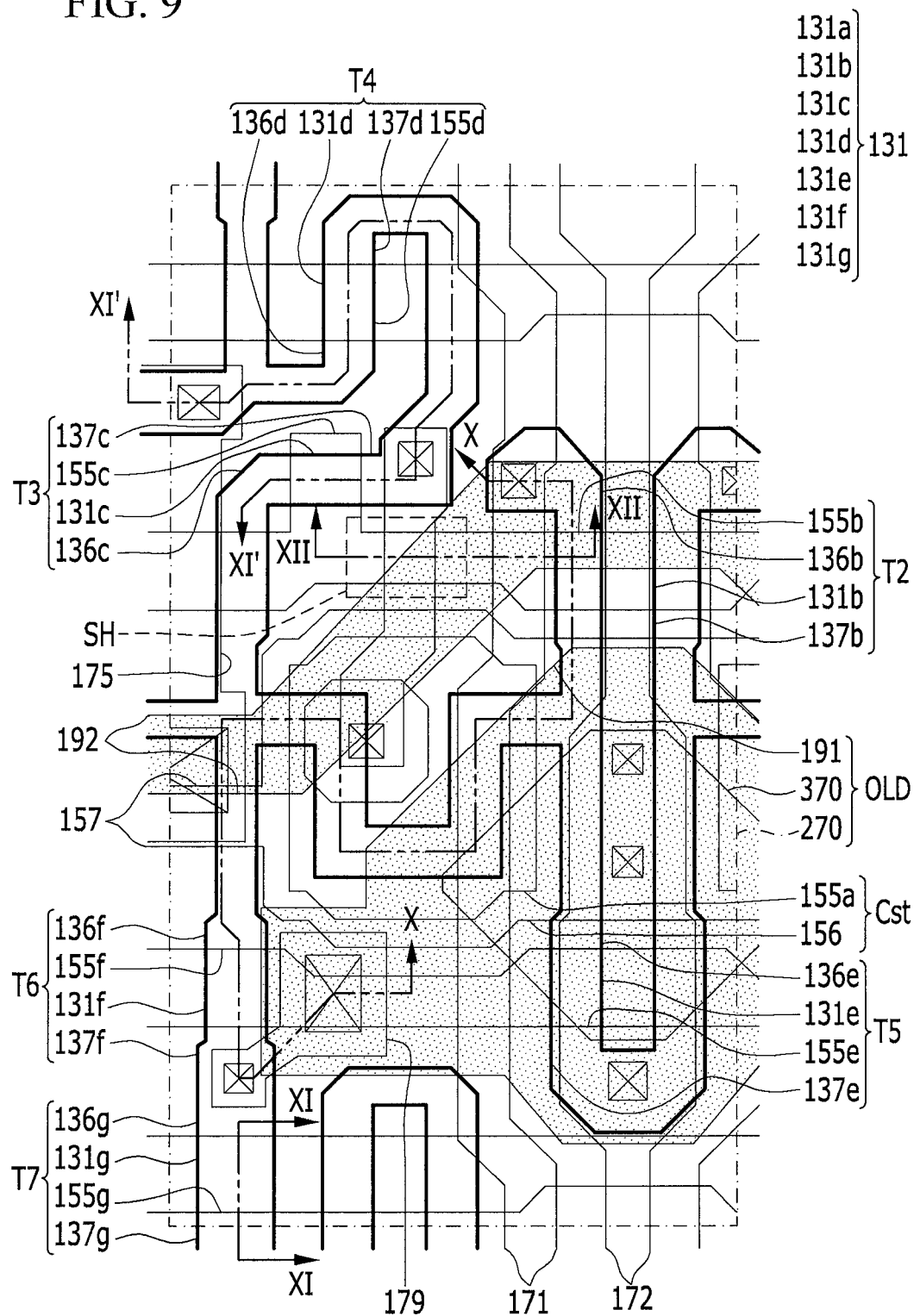
FIG. 9 is a detailed layout view of FIG. 8.
Figure 10:
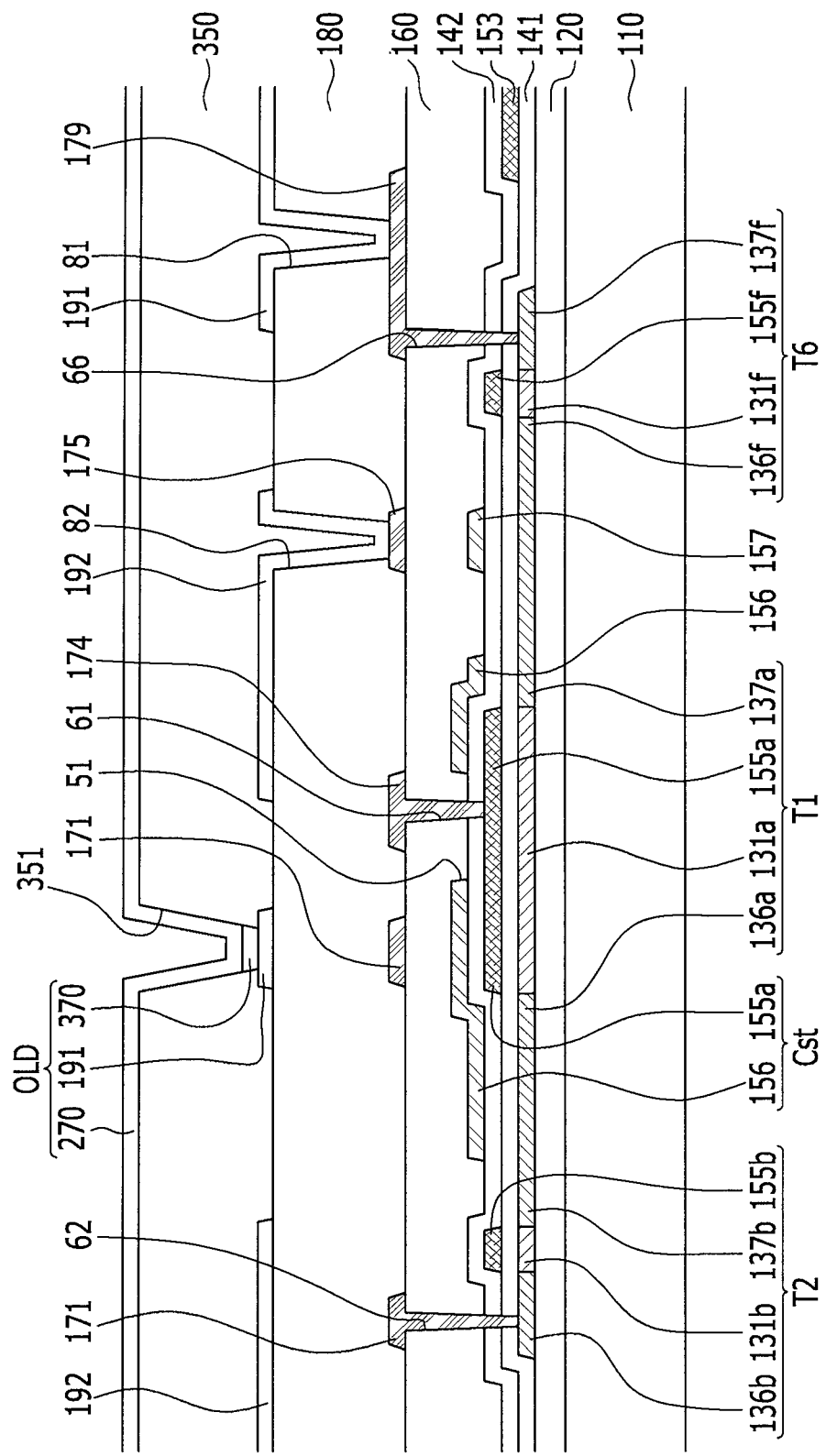
FIG. 10 is a cross-sectional view of the organic light emitting diode display illustrated in FIG. 9 taken along the line X-X of FIG. 9.
Figure 11:
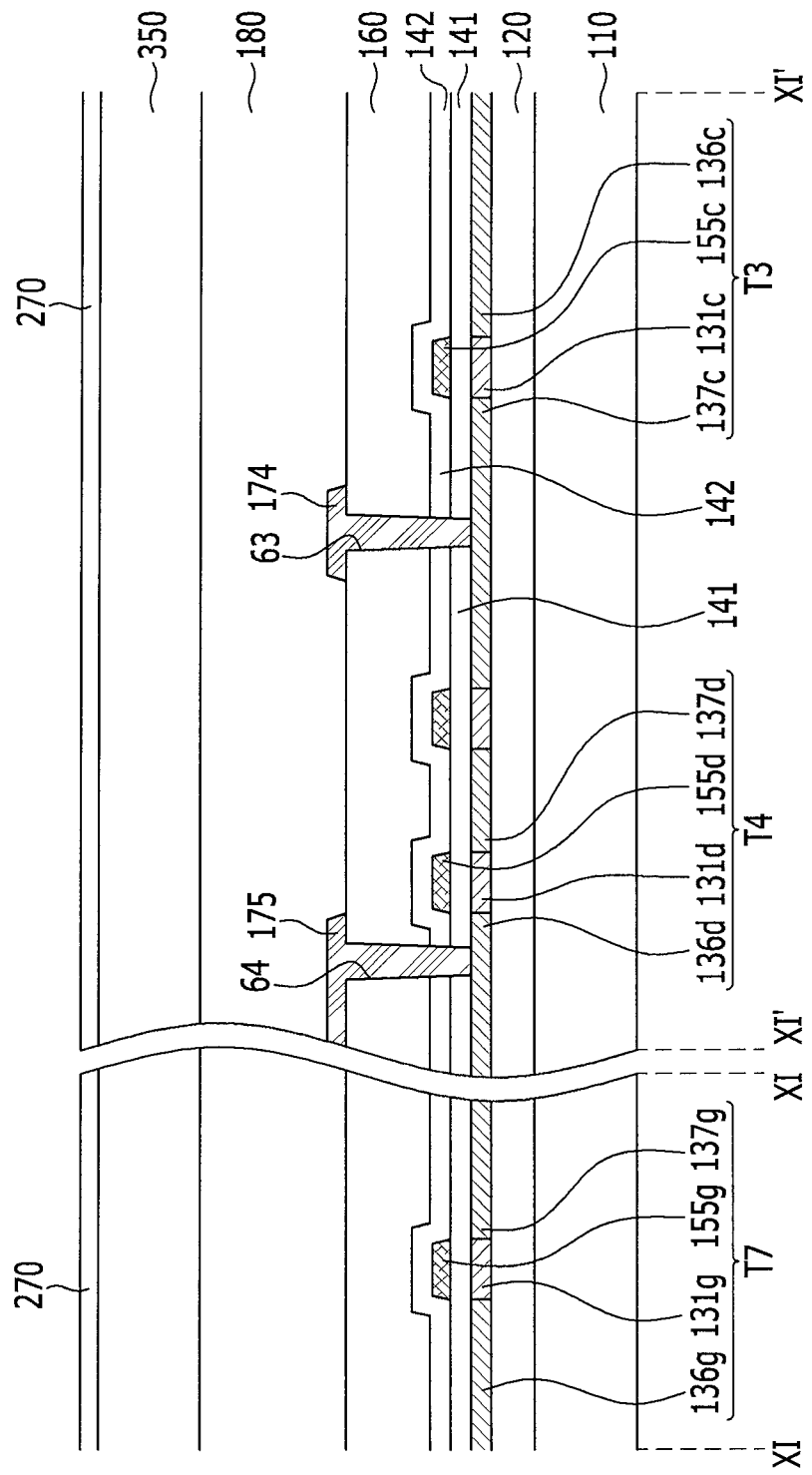
FIG. 11 is a cross-sectional view of the organic light emitting diode display illustrated in FIG. 9 taken along the lines XI-XI and XI'-XI' of FIG. 9.
Figure 12:
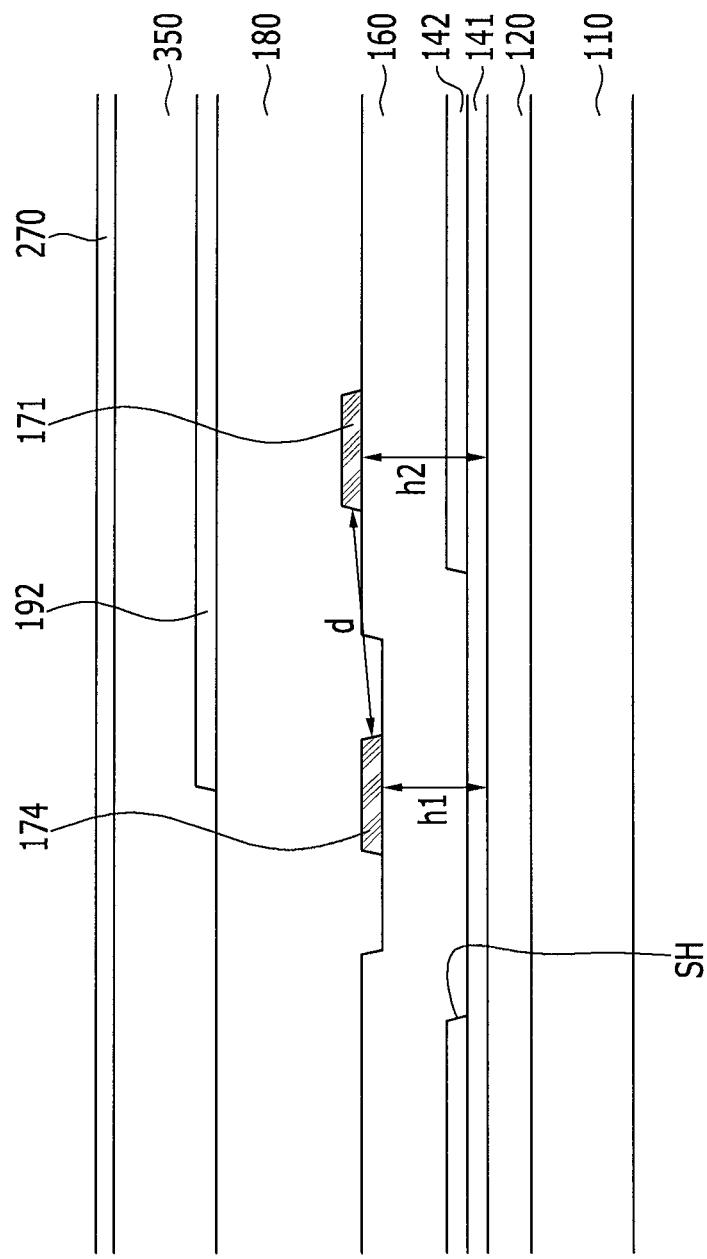
FIG. 12 is a cross-sectional view of the organic light emitting diode display illustrated in FIG. 9 taken along the line XII-XII of FIG. 9.

FIG. 8 is a view of a plurality of transistors and a capacitor of an organic light emitting diode display according to another exemplary embodiment of the present disclosure, FIG. 9 is a detailed layout view of FIG. 8, FIG. 10 is a cross-sectional view of the organic light emitting diode display illustrated in FIG. 9 taken along the line X-X of FIG. 9, FIG. 11 is a cross-sectional view of the organic light emitting diode display illustrated in FIG. 9 taken along the line XI-XI of FIG. 9, and FIG. 12 is a cross-sectional view of the organic light emitting diode display illustrated in FIG. 9 taken along the line XII-XII of FIG. 9.

As shown in FIG. 8 and FIG. 9, the storage capacitor Cst of the organic light emitting diode display according to an exemplary embodiment of the present disclosure includes the first storage electrode 155a and the second storage electrode 156 with the second gate insulating layer 142 interposed therebetween. The first storage electrode 155a corresponds to the driving gate electrode 155a, and the second storage electrode 156 is a portion of a storage line 157 that has been extended to have a wider area than the driving gate electrode 155a and covers the entire driving gate electrode 155a.

In one embodiment, the second gate insulating layer 142 is the dielectric material, and the storage capacitance is realized by the charge charged in the storage capacitor Cst and the voltage between the two capacitive plates 155a and 156.

The first storage electrode 155a as the driving gate electrode 155a is connected to one end of the driving connecting member 174 via the contact opening 61 and a storage opening 52. The storage opening 52 is an opening formed in the second storage electrode 156. Accordingly, the contact opening 61 connecting one end of the driving connecting member 174 and the driving gate electrode 155a is formed in (e.g., extends through) the storage opening 52. The driving connecting member 174 is formed to be parallel to and on the same layer as the data line 171, and the other end of the driving connecting member 174 is connected to the compensation drain electrode 137c of the compensation transistor T3 and the initialization drain electrode 137d of the initialization transistor T4 via the contact opening 63. Accordingly, the driving connecting member 174 connects the driving gate electrode 155a and the compensation drain electrode 137c of the compensation transistor T3 and the initialization drain electrode 137d of the initialization transistor T4.

The second storage electrode 156 is connected to the driving voltage line 172 via a contact opening 69 (e.g., a contact hole).

A shielding opening SH is formed under (e.g., is aligned with) the driving connecting member 174 and extends along the direction parallel to the data line 171 such that a height h1 of the driving connecting member 174 is less than a height h2 of the data line 171 (e.g., a height between the substrate 110 and the data line 171 is less than a height between the substrate 110 and the driving connecting member 174). Accordingly, a straight interval d (e.g., a straight-line distance) between the data line 171 and the driving connecting member 174 is increased such that parasitic capacitance between the driving connecting member 174 and the data line 171 is reduced or minimized.

Also, kickback voltage due to parasitic capacitance is reduced or minimized such that the change of the driving gate voltage Vg of the driving gate electrode 155a connected to the driving connecting member 174 as the driving gate node GN is relatively small, thereby reducing or minimizing vertical crosstalk.

The light emission control connecting member 179 is connected to the pixel electrode 191 via the contact opening 81, and the initialization connecting member 175 is connected to the initialization voltage line 192 via the contact opening 82.

Hereinafter, the cross-sectional structures of the organic light emitting diode display device according to an exemplary embodiment of the present disclosure will be described in more detail with reference to FIG. 10, FIG. 11, and FIG. 12.

In one embodiment, because the stacked structures of the operation control transistor T5 is substantially the same as that of the light emission control transistor T6, a detailed description thereof may be omitted.

A buffer layer 120 may be formed on the insulating substrate 110. The insulating substrate 110 may be formed of an insulating material, such as glass, crystal, ceramic, or plastic. The buffer layer 120 blocks impurities from the insulating substrate 110 during a crystallization process for forming a polycrystalline semiconductor to improve characteristics of the polycrystalline semiconductor and reduce stress applied to the insulating substrate 110. The buffer layer 120 may be formed of silicon nitride ($SiN_x$) and/or silicon oxide ($SiO_x$).

The semiconductor 130, including the driving channel 131a, the switching channel 131b, the compensation channel 131c, the initialization channel 131d, the operation control channel 131e, the light emission control channel 131f, and the bypass channel 131g, is formed on the buffer layer 120. A driving source electrode 136a and a driving drain electrode 137a are formed at (e.g., on) respective sides of the driving channel 131a of the semiconductor 130, and a switching source electrode 136b and a switching drain electrode 137b are formed at (e.g., on) respective sides of the switching channel 131b. The compensation source electrode 136c and the compensation drain electrode 137c are formed at respective sides of the compensation channel 131c, and the initialization source electrode 136d and the initialization drain electrode 137d are formed at respective sides of the initialization channel 131d. The operation control source electrode 136e and the operation control drain electrode 137e are formed at respective sides of the operation control channel 131e, and the light emission control source electrode 136f and the light emission control drain electrode 137f are formed at respective sides of the light emission control channel 131f. The bypass source electrode 136g and the bypass drain electrode 137g are formed at respective sides of the bypass channel 131g.

A first gate insulating layer 141 is formed to cover the semiconductor 130. A switching gate electrode 155b, a scan line 151 including a compensation a gate electrode 155c, a previous scan line 152 including an initialization gate electrode 155d, an emission control line 153 including an operation control gate electrode 155e and an emission control gate electrode 155f, a bypass control line 158 including a bypass gate electrode 155g, and a driving gate electrode 155a (i.e., a first storage electrode 155a) are formed on the first gate insulating layer 141. The components 151, 152, 153, 158, and 155a may be formed having a multilayer structure in which a metal layer including copper (Cu), a copper alloy, aluminum (Al), an aluminum alloy, molybdenum (Mo), and/or a molybdenum alloy is deposited.

A second gate insulating layer 142 is formed to cover the components 151, 152, 153, 158, and 155a and the first gate insulating layer 141. The first gate insulating layer 141 and the second gate insulating layer 142 may be formed of silicon nitride ($SiN_x$) and/or silicon oxide ($SiO_x$).

A shielding opening SH is formed in the second gate insulating layer 142 at the position overlapping the driving connecting member 174.

A storage line 157 parallel to the scan line 151 and a second storage electrode 156 that is a portion of the storage line 157 extended therefrom is formed on the second gate insulating layer 142. The components 157 and 156 may be formed of the same material as the components 151, 152, 153, 158, and 155a.

The second storage electrode 156 is wider than the first storage electrode 155a functioning as the driving gate electrode, such that the second storage electrode 156 covers the entire driving gate electrode 155a. Accordingly, the second storage electrode 156 does not influence influencing the driving gate electrode 155a to affect the voltage of the pixel electrode 191 overlapping the driving gate electrode 155a.

An interlayer insulating layer 160 is formed on the second gate insulating layer 142 and the components 157 and 156. The interlayer insulating layer 160 may be formed of silicon nitride ($SiN_x$) and/or silicon oxide ($SiO_x$). In one embodiment, the shielding opening SH formed under the driving connecting member 174 is filled with the interlayer insulating layer 160, and the interlayer insulating layer 160 and the first gate insulating layer 141 are in contact in the shielding opening SH.

The interlayer insulating layer 160 has contact openings 61, 62, 63, 64, 65, 66, and 69. A data line 171, a driving voltage line 172, a driving connecting member 174, an initialization connecting member 175, and a light emission control connecting member 179 are formed on the interlayer insulating layer 160. The data line 171 is connected to the switching source electrode 136b via the contact opening 62 formed in the first gate insulating layer 141, the second gate insulating layer 142, and the interlayer insulating layer 160. The driving voltage line 172 is connected to the second storage electrode 156 via the contact opening 69 formed in the interlayer insulating layer 160.

One end of the driving connecting member 174 is connected to the first storage electrode 155a via the contact opening 61 formed in the second gate insulating layer 142 and the interlayer insulating layer 160, and the other end of the driving connecting member 174 is connected to the compensation drain electrode 137c and the initialization drain electrode 137d via the contact opening 63 formed in the first gate insulating layer 141, the second gate insulating layer 142, and the interlayer insulating layer 160.

The shielding opening SH is formed under the driving connecting member 174 such that the height h1 of the driving connecting member 174 is less than the height h2 of the data line 171. Accordingly, a straight interval d between the data line 171 and the driving connecting member 174 is increased such that parasitic capacitance between the driving connecting member 174 and the data line 171 is reduced or minimized.

The initialization connecting member 175 is connected to the initialization source electrode 136d via the contact opening 64 formed in the first gate insulating layer 141, the second gate insulating layer 142, and the interlayer insulating layer 160. The light emission control connecting member 179 is connected to the light emission control drain electrode 137f via the contact opening 66 formed in the first gate insulating layer 141, the second gate insulating layer 142, and the interlayer insulating layer 160.

A passivation layer 180 is formed to cover the components 171, 172, 174, 175, and 179, and the interlayer insulating layer 160. The pixel electrode 191 and the initialization voltage line 192 are formed on the passivation layer 180. The light emission control connecting member 179 is connected to the pixel electrode 191 via the contact opening 81 formed in the passivation layer 180, and the initialization connecting member 175 is connected to the initialization voltage line 192 via the contact opening 82 formed in the passivation layer 180.

A pixel definition layer 350 is formed on the passivation layer 180, the initialization voltage line 192, and an edge of the pixel electrode 191. The pixel definition layer 350 has a pixel opening 351 exposing the pixel electrode 191. An organic emission layer 370 is formed on the pixel electrode 191 exposed by the pixel opening 351, and a common electrode 270 is formed on the organic emission layer 370. The common electrode 270 is formed on the pixel defined layer 350 to be formed through the plurality of pixels PX. As such, an organic light emitting diode OLD is formed, which includes the pixel electrode 191, the organic emission layer 370, and the common electrode 270.

While this disclosure has been described in connection with what is presently considered to be practical exemplary embodiments, it is to be understood that the disclosure is not limited to the disclosed embodiments but is intended to cover various modifications and equivalent arrangements included within the spirit and scope of the appended claims and their equivalents.

DESCRIPTION OF SOME REFERENCE SYMBOLS

| | |
|---|---|
| 51: storage groove | 52: storage opening |
| 55: first shielding member | 56: second shielding member |
| 131a: driving channel | 132b: switching channel |
| 140: gate insulating layer | 141: first gate insulating layer |
| 142: second gate insulating layer | 151: scan line |
| 152: previous scan line | 153: light emission control line |
| 155a: driving gate electrode | 155b: switching gate electrode |
| 156: second storage electrode | 157: storage line |
| 160: interlayer insulating layer | 171: data line |
| 172: driving voltage line | 174: driving connecting member |
| 175: initialization connecting member | 179: light emission control connecting member |
| 180: passivation layer | 191: pixel electrode |
| 192: initialization voltage line | 270: common electrode |
| 350: pixel definition layer | 370: organic emission layer |
| SH: shielding opening | |

What is claimed is:

1. An organic light emitting diode display comprising:
   a substrate;
   a scan line on the substrate and configured to transmit a scan signal;
   a data line crossing the scan line and configured to transmit a data voltage;
   a driving voltage line crossing the scan line and configured to transmit a driving voltage, a portion of the driving voltage line being a second storage electrode;
   a switching transistor connected to the scan line and the data line;
   a driving transistor connected to the switching transistor, and comprising a driving gate electrode;
   a driving connecting member connected to the driving gate electrode;
   a first storage electrode being a portion of the driving gate electrode, the second storage electrode overlapping the first storage electrode;

a shielding member connected to the second storage electrode and between the driving connecting member and the data line in a plan view; and an organic light emitting diode connected to the driving transistor, wherein the shielding member is non-overlapping with the data line.

2. The organic light emitting diode display of claim 1, wherein:

the data line comprises a first data line and a second data line adjacent to each other, and the shielding member comprises a first shielding member between the driving connecting member and the first data line and a second shielding member between the driving connecting member and the second data line.

3. The organic light emitting diode display of claim 2, wherein:

the first shielding member and the second shielding member are on the same layer as the scan line.

4. The organic light emitting diode display of claim 3, further comprising:

a gate insulating layer on the substrate; and an interlayer insulating layer covering the first shielding member and the second shielding member, the first shielding member and the second shielding member being on the gate insulating layer, wherein the first shielding member and second shielding member are connected to the second storage electrode via a first shielding connection opening and a second shielding connection opening, the first shielding connection opening and the second shielding connection opening extending through the interlayer insulating layer.

5. The organic light emitting diode display of claim 4, wherein:

the second storage electrode, the driving voltage line, the driving connecting member, and the data line are on the interlayer insulating layer.

6. The organic light emitting diode display of claim 1, further comprising:

a compensation transistor configured to be turned on in accordance with the scan signal and to compensate a threshold voltage of the driving transistor, the compensation transistor being connected to a driving drain electrode of the driving transistor, wherein the driving connecting member connects a compensation drain electrode of the compensation transistor and the driving gate electrode to each other.

7. The organic light emitting diode display of claim 1, further comprising:

a semiconductor on the substrate and comprising a switching channel of the switching transistor and a driving channel of the driving transistor, wherein the driving channel overlaps the driving gate electrode, and wherein the driving channel is curved.

8. The organic light emitting diode display of claim 1, wherein:

the driving voltage line comprises a first driving voltage line parallel to the data line and a second driving voltage line crossing the data line, and the first driving voltage line is on the same layer as the data line, and the second driving voltage line is on the same layer as the scan line.

9. An organic light emitting diode display comprising:

a substrate;

a scan line on the substrate and configured to transmit a scan signal;

a data line and a driving voltage line crossing the scan line and configured to transmit a data voltage and a driving voltage, respectively;

a switching transistor connected to the scan line and the data line;

a driving transistor connected to the switching transistor;

a driving connecting member connected to a driving gate electrode of the driving transistor, the driving connecting member and the data line being formed on a same layer; and an organic light emitting diode connected to the driving transistor, wherein a first height between the substrate and the driving connecting member is different than a second height between the substrate and the data line.

10. The organic light emitting diode display of claim 9, wherein the first height between the substrate and the driving connecting member is less than the second height between the substrate and the data line.

11. The organic light emitting diode display of claim 9, further comprising:

a first gate insulating layer, a second gate insulating layer, and an interlayer insulating layer sequentially formed on the substrate, wherein a portion of the driving connecting member is on the first gate insulating layer and the interlayer insulating layer, and wherein the data line is on the first gate insulating layer, the second gate insulating layer, and the interlayer insulating layer.

12. The organic light emitting diode display of claim 11, wherein:

the portion of the driving connecting member is aligned with a shielding opening in the second gate insulating layer.

13. The organic light emitting diode display of claim 12, further comprising a first storage electrode, wherein the scan line and the first storage electrode are between the first gate insulating layer and the second gate insulating layer.

14. The organic light emitting diode display of claim 12, further comprising a compensation transistor configured to be turned on in accordance with the scan signal and to compensate a threshold voltage of the driving transistor, wherein:

one end of the driving connecting member is connected to the driving gate electrode via a contact opening extending through the second gate insulating layer and the interlayer insulating layer, and the other end of the driving connecting member is connected to a compensation drain electrode of the compensation transistor via a contact opening extending through the first gate insulating layer, the second gate insulating layer, and the interlayer insulating layer.

15. The organic light emitting diode display of claim 14, further comprising a second storage electrode, wherein:

the second storage electrode has a storage opening exposing the second gate insulating layer, and one end of the driving connecting member and the driving gate electrode are connected via a contact opening extending through the storage opening.

16. The organic fight emitting diode display of claim 14, wherein:
  the driving connecting member is on the same layer as and spaced from the data line.

17. The organic light emitting diode display of claim 14, further comprising:
  a semiconductor on the substrate and comprising a switching channel of the switching transistor and a driving channel of the driving transistor, and
  wherein the driving channel overlaps the driving gate electrode, and
  wherein the driving channel is curved.

18. The organic light emitting diode display of claim 14, wherein:
  the organic light emitting diode comprises:
  a pixel electrode connected to the driving transistor;
  an organic emission layer on the pixel electrode; and
  a common electrode on the organic emission layer, and
  an initialization voltage line is on the same layer as the pixel electrode and is configured to transmit an initialization voltage to initialize the driving transistor.

\* \* \* \* \*

UNITED STATES PATENT AND TRADEMARK OFFICE
CERTIFICATE OF CORRECTION

PATENT NO. : 10,121,415 B2
APPLICATION NO. : 14/919680
DATED : November 6, 2018
INVENTOR(S) : Dong Sun Lee et al.

It is certified that error appears in the above-identified patent and that said Letters Patent is hereby corrected as shown below:

In the Claims
Column 25, Line 1, Claim 16    delete "fight"
                               insert -- light --

Signed and Sealed this
Twenty-ninth Day of October, 2019

Andrei Iancu
*Director of the United States Patent and Trademark Office*